United States Patent [19]

Oda et al.

[11] Patent Number: 5,557,129
[45] Date of Patent: Sep. 17, 1996

[54] SEMICONDUCTOR MOSFET DEVICE HAVING A SHALLOW NITROGEN IMPLANTED CHANNEL REGION

[75] Inventors: Hidekazu Oda; Shuichi Ueno; Takehisa Yamaguchi, all of Hyogo, Japan

[73] Assignee: Mitsubishi Denki Kabushiki Kaisha, Tokyo, Japan

[21] Appl. No.: 452,611

[22] Filed: May 25, 1995

[30] Foreign Application Priority Data

Jun. 22, 1994 [JP] Japan ................... 6-140542

[51] Int. Cl.$^6$ ............................. H01L 31/062
[52] U.S. Cl. .................. 257/345; 257/607; 257/655; 257/339; 437/97
[58] Field of Search ................ 257/65, 66, 339, 257/345, 349, 354, 376, 407, 410, 607, 655; 437/97

[56] References Cited

U.S. PATENT DOCUMENTS 4,755,865  7/1988  Wilson et al. .............. 257/66

*Primary Examiner*—Jerome Jackson, Jr.
*Assistant Examiner*—John Guay
*Attorney, Agent, or Firm*—Lowe, Price, LeBlanc & Becker

[57] ABSTRACT

A boron diffusion region is formed at a surface of a silicon substrate. A pair of n-type source/drain regions are formed at a surface of boron diffusion region. A gate electrode is formed at a region located between paired source/drain regions with a gate insulating film therebetween. A nitrogen implanted region is formed at the surface of silicon substrate located between paired n-type source/drain regions. Nitrogen implanted region has a peak nitrogen concentration at a position of a depth not exceeding 500 Å from the surface of silicon substrate. Thereby, a transistor structure which can be easily miniaturized can be obtained.

10 Claims, 25 Drawing Sheets

5,557,129

SEMICONDUCTOR MOSFET DEVICE HAVING A SHALLOW NITROGEN IMPLANTED CHANNEL REGION

BACKGROUND OF THE INVENTION

1. Field of the Invention

The present invention relates to a semiconductor device and a method of manufacturing the same, and in particular, to a semiconductor device having a field-effect transistor and a method of manufacturing the same.

2. Description of the Background Art

In recent years, semiconductor devices typically including an SRAM (Static Random Access Memory) and a DRAM (Dynamic Random Access Memory) have been highly integrated to have such a structure that each chip includes many elements. Among these elements, a majority of transistors are field-effect transistors called MOSFETs (Metal Oxide Semiconductor Field Effect Transistors).

The MOSFETs can be classified into two types having different electric polarities, i.e., an nMOSFET (negative MOSFET) in which electrons flow through a channel region and a pMOSFET (positive MOSFET) in which holes flows. These nMOSFETs and pMOSFETs are combined to form various kinds of circuits.

Structures of such transistors can be roughly classified into a surface channel type and a buried channel type. Generally in the CMOS structure which consists of an MOSFET and a pMOSFET on the same substrate, the nMOSFET of the surface channel type and the pMOSFET of the buried channel type are broadly employed because it is necessary to use the same gate electrode material for the nMOSFET and pMOSFET. Structures of the conventional nMOSFET and pMOSFET will be described below.

FIG. 40 is a schematic cross section showing a structure of a conventional nMOSFET. Referring to FIG. 40, a silicon substrate 501 is provided at its surface with a boron diffusion region 503 of p-type. A pair of n-type source/drain regions 507 are formed at the surface of boron diffusion region 503 with a predetermined space between each other. A gate electrode 511 is formed at a region located between paired source/drain regions 507 with a gate insulating film 509 therebetween.

Paired n-type source/drain regions 507, gate insulating film 509 and gate electrode 511 form an nMOSFET 520 of surface channel type.

Side walls of gate electrode 511 are covered with side wall spacer 513.

FIG. 41 is a cross section schematically showing a structure of a conventional pMOSFET. Referring to FIG. 41, a silicon substrate 601 is provided at its surface with a phosphorus diffusion region 603 of n-type. A pair of p-type source/drain regions 607 are formed at the surface of phosphorus diffusion region 603 with a predetermined spaced between each other. A gate electrode 611 is formed at a region located between paired source/drain regions 607 with a gate insulating film 609 therebetween. A p-type buried channel region 615 is formed at the surface of phosphorus diffusion region 603 located between paired source/drain regions 607.

Paired p-type source/drain regions 607, gate insulating film 609, gate electrode 611 and p-type buried channel region 615 form a pMOSFET 620 of buried channel type.

Side walls of gate electrode 611 are covered with side wall spacer 613.

A method of manufacturing the conventional nMOSFET shown in FIG. 40 will be described below.

FIGS. 42 to 46 are schematic cross sections showing the process of manufacturing the conventional nMOSFET in accordance with the order of process steps. Referring first to FIG. 42, the ordinary LOCOS (Local Oxidation of Silicon) is executed to form isolating oxide films 521 on silicon substrate 501. In this step, isolating implantation regions 523 under isolating oxide films 521 are formed. Thereafter, a pad oxide film 531 of a predetermined thickness is formed to cover the whole surface.

Referring to FIG. 43, boron (B) is implanted into the whole surface. Then, a heat processing is executed to activate and diffuse the implanted boron, so that boron diffusion region 503 is formed at the surface of silicon substrate 501. Thereafter, pad oxide film 531 is removed, e.g., by etching.

Thereby, the surface of boron diffusion region 503 is exposed as shown in FIG. 44.

Referring to FIG. 45, thermal oxidation is effected, so that a silicon oxide film 509a as the gate insulating film is formed on the whole surface.

Referring to FIG. 46, patterned gate electrode 511 is formed on the surface of gate insulating film 509a. Using gate electrode 511 as a mask, ion implantation or the like is performed to form at the surface paired n-type source/drain regions 507 spaced by a predetermined distance. Then, side wall spacer 513 are formed to cover the side walls of gate electrode 511.

(a) As transistors are miniaturized to a higher extent, a concentration of impurity generally increases in accordance with a scaling rule. In accordance with this, the impurity concentration at the channel region increases in MOSFET 520 shown in FIG. 40, and thus inversion of the surface of channel region is suppressed. This results in increase of a threshold voltage of MOSFET 520 of surface channel type.

(b) If the impurity concentration at the channel region increases in MOSFET 520, carriers moving in the channel scatter to a higher extent. Therefore, mobility of minority carriers at the channel decreases, so that improvement of the drive performance of transistor cannot be substantially expected.

(c) In the pMOSFET 620 of buried channel type shown in FIG. 41, buried channel region 615 is of p-type having the same polarity as source/drain regions 607, and makes connection between paired p-type source/drain regions 607. By controlling gate applied voltage, the degree of depletion in buried channel region 615 can be changed for modulating the current flowing through the channel.

However, the depletion layer width formed by the gate electric field is smaller than 50 nm from the substrate surface. Further, the depletion layer at the p-n junction between buried channel region 615 and phosphorus diffusion region 603 expands for only about 50 nm or less toward buried channel region 615. Therefore, the depth of buried channel region 615 must be smaller than about 100 nm in order to deplete whole buried channel region 615 by the gate voltage.

In general, p-type buried channel region 615 is formed by implantation of boron. Since boron has a small mass and a large diffusion coefficient, it is difficult to form a shallow buried diffusion region, and its depth from the substrate surface exceeds 100 nm due to a heat treatment at a later step. When the depth of buried channel region 615 from the substrate surface exceeds 100 nm, a non-depleted region is formed at buried channel region 615 even if a voltage is applied to gate electrode 611. In this case, a current which cannot be controlled by gate electrode 611, i.e., so-called punch-through current is generated.

(d) In pMOSFET 620, source/drain regions 607 are formed by implantation of boron. As already described, boron has a strong tendency to diffuse. Therefore, it is difficult to suppress diffusion of boron from source/drain regions 607 toward the channel region. Accordingly, an effective channel length decreases, which makes it difficult to miniaturize the transistor structure.

For the above reasons (a)–(d), it is difficult to miniaturize the conventional MOSFET.

SUMMARY OF THE INVENTION

An object of the invention is to provide a transistor structure which can be miniaturized without difficulty.

Another object of the invention is to improve a drive performance of a transistor while allowing miniaturization of a transistor structure.

Yet another object of the invention is to suppress generation of a punch-through current during operation of a transistor even in the case where a transistor structure is miniaturized.

According to one aspect of the invention, a semiconductor device having a field-effect transistor includes a semiconductor substrate, a pair of source/drain regions, a gate electrode, and a nitrogen introduced region. The semiconductor substrate is of a first conductivity type, and has a main surface. The paired source/drain regions are of a second conductivity type, and are formed at the main surface of the semiconductor substrate with a predetermined space between each other. The gate electrode is opposed to a region located between the paired source/drain regions and is formed on the main surface of the semiconductor substrate with a gate insulating film therebetween. The nitrogen introduced region is formed at a region of the semiconductor substrate located between the paired source/drain regions, contains nitrogen, and has a concentration peak of the nitrogen. The concentration peak of the nitrogen extends from the main surface of the semiconductor substrate to a position at a depth not exceeding 500 Å.

According to another aspect of the invention, a semiconductor device having a field-effect transistor includes a semiconductor substrate, a pair of source/drain regions, a gate electrode, and a nitrogen introduced region. The semiconductor substrate is of a first conductivity type, and has a main surface. The paired source/drain regions are of a second conductivity type, and are formed at the main surface of the semiconductor substrate with a predetermined space between each other. The gate electrode is opposed to a region located between the paired source/drain regions and is formed on the main surface of the semiconductor substrate with a gate insulating film therebetween. The nitrogen introduced region is formed at a region of the semiconductor substrate located between the paired source/drain regions, contains nitrogen, and has a peak concentration of the nitrogen. The peak concentration of the nitrogen is located at the main surface of the semiconductor substrate.

According to the semiconductor device of the former aspect of the invention described above, the nitrogen introduced region has the peak concentration of the nitrogen extending from the main surface of the semiconductor substrate to the position at the depth not exceeding 500 Å. According to the semiconductor device of the latter aspect of the invention described above, the nitrogen introduced region has the peak concentration of the nitrogen located at the main surface of the semiconductor substrate. Thus, in the semiconductor devices according to these two aspects, the nitrogen introduced region is located at the channel region of the field-effect transistor. The nitrogen can serve to suppress diffusion of boron. Therefore, the boron outside the channel region is prevented from diffusing into the channel region, so that increase of a threshold voltage of a transistor in an nMOSFET is suppressed, and a drive performance of the transistor can be improved. Meanwhile, in a pMOSFET, the source/drain regions formed by implantation of boron are prevented from extending toward the channel region, so that a long effective channel length can be ensured. Since the boron in the channel region is prevented from diffusing into a region outside the channel region, the buried channel region in the buried type pMOSFET is prevented from extending unnecessarily deeply from the substrate surface, and generation of a punch-through current is suppressed. For the above reasons, the transistor structure can be miniaturized without difficulty.

According to the semiconductor device of a preferred aspect of the invention, the semiconductor substrate has a p-type region containing boron introduced thereinto, and the paired source/drain regions are of an n-type conductivity type.

According to the semiconductor device of the above aspect of the invention, the boron introduced into semiconductor substrate tends to diffuse toward the channel region, e.g., due to heat treatment at a later step. However, the channel region has the nitrogen introduced region, so that diffusion of boron into the channel region is prevented. Therefore, the boron concentration can be low at the channel region, so that an inversion layer can be easily formed at the channel region. Accordingly, the threshold voltage of the transistor can be set low.

Since the boron concentration can be low at the channel region, impurity scattering of electrons flowing through the channel can be suppressed to a considerable extent. This improves the current drive performance of the transistor.

Further, it is possible to increase the boron concentration at a position deeper than the channel region from the substrate surface, while maintaining the low boron concentration at the channel region. Therefore, punch-through at a deep portion of the substrate can be prevented, and a punch-through breakdown voltage can be improved.

According to still another preferred aspect of the invention, the semiconductor device further includes a buried channel region of n-type formed at a region of the semiconductor substrate located between the paired source/drain regions. A p-n junction formed by the n-type buried channel region and the p-type region in the semiconductor substrate containing the boron introduced thereinto is located within the nitrogen introduced region.

According to the semiconductor device of the above preferred aspect, the boron in the substrate tends to diffuse from a deep position in the substrate toward the buried channel region, e.g., due to a heat treatment at a later step. However, diffusion of the boron introduced into the substrate toward the channel region is prevented owing to provision of the nitrogen introduced region at the channel region. Therefore, at the vicinity of the p-n junction formed by the boron introduced into the substrate and the buried channel region, a large concentration gradient in the buried channel region is maintained. Therefore, a large potential in the direction of depth can be ensured at the buried region, and a wide channel region can be ensured. Accordingly, the drive performance of the transistor can be improved.

Further, it is possible to increase the boron concentration at a position deeper than the channel region from the substrate surface, while preventing diffusion of boron introduced into the substrate toward the channel region. Therefore, punch-through at a deep portion of the substrate can be prevented, and a punch-through breakdown voltage can be improved.

According to the semiconductor device of further another preferred aspect of the invention, the semiconductor substrate has an n-type region, and the paired source/drain regions have a p-type region containing boron introduced thereinto.

According to the semiconductor device of the above aspect of the invention, the boron in the source/drain regions tends to diffuse toward the channel region due to, e.g., a heat treatment at a later step. However, the channel region is provided with the nitrogen introduced region, so that diffusion of boron in the source/drain regions into the channel region is prevented. Therefore, extension of the source/drain regions toward the channel region is prevented, so that a large effective channel length can be ensured.

The semiconductor device of further preferred aspect of the invention further includes a buried channel region of p-type formed by introduction of boron into the main surface of the semiconductor substrate located between the paired source/drain regions. A p-n junction formed by the p-type buried channel region and the n-type region in the semiconductor substrate is located within the nitrogen introduced region.

According to the semiconductor device of the above aspect of the invention, the boron in the buried channel region tends to diffuse from a portion near the substrate surface toward a deep portion due to, e.g., a heat treatment at a later step. However, the channel region is provided with the nitrogen introduced region, so that the boron in the channel region is prevented from diffusing into the deep portion of the substrate. Therefore, the buried channel region can be shallow, and the buried channel region can be entirely controlled by a gate voltage to form a depletion layer, so that generation of a punch-through current is suppressed.

A method of manufacturing a semiconductor device having a field-effect transistor according to one aspect of the invention includes the following steps.

First, a pair of source/drain regions of a second conductivity type is formed at a main surface of a semiconductor substrate of a first conductivity type with a predetermined space between each other. A gate electrode opposed to a region located between the paired source/drain regions is formed on the main surface of the semiconductor substrate with a gate insulating film therebetween. A nitrogen introduced region having a peak concentration of the nitrogen extending to a position at a depth not exceeding 500 Å from the surface of the semiconductor substrate is formed at a region of the semiconductor substrate located between the paired source/drain regions.

The above manufacturing method can manufacture the semiconductor substrate according to the aforementioned one aspect of the invention having the effects described before.

A method of manufacturing a semiconductor device having a field-effect transistor according to another aspect of the invention includes the following steps.

First, a pair of source/drain regions of a second conductivity type is formed at a main surface of a semiconductor substrate of a first conductivity type with a predetermined space between each other. A gate electrode opposed to a region located between the paired source/drain regions is formed on the main surface of the semiconductor substrate with a gate insulating film therebetween. A nitrogen introduced region having a peak concentration of the nitrogen located at the main surface of the semiconductor substrate is formed at a region of the semiconductor substrate located between the paired source/drain regions.

The above manufacturing method can manufacture the semiconductor substrate according to aforementioned another aspect of the invention having the effects described before.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.
Embodiment 1

Figure 1:
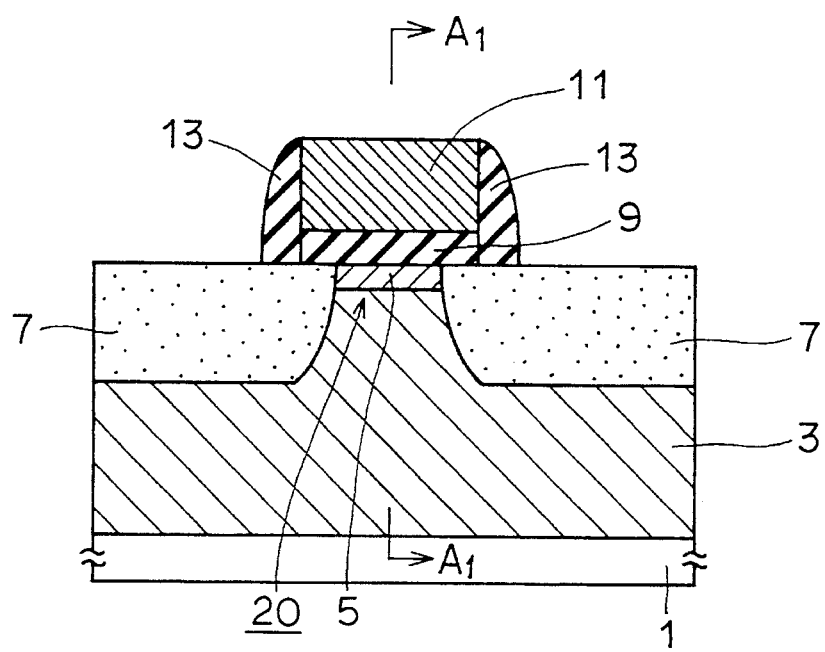
FIG. 1 is a cross section schematically showing a structure of a semiconductor device of a first embodiment of the invention.
Figure 2:
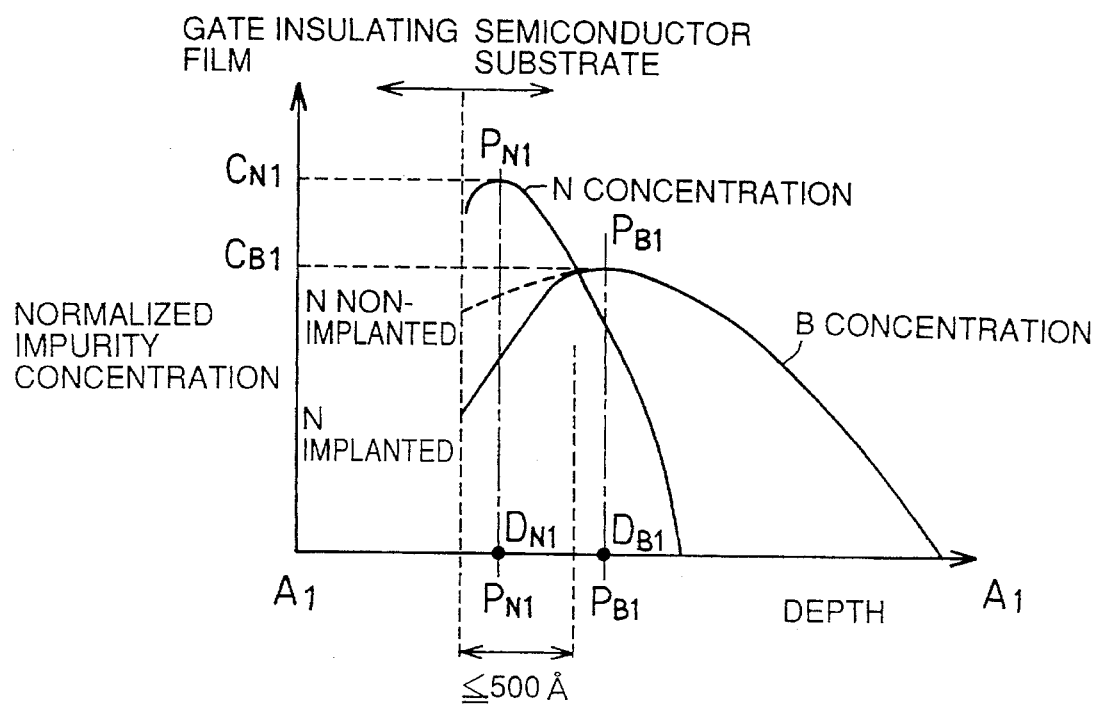
FIG. 2 shows an impurity concentration corresponding to positions along line $A_1$—$A_1$ in FIG. 1.

Referring to FIGS. 1 and 2, a silicon substrate 1 is provided at its surface with a boron diffusion region 3. A pair of n-type source/drain regions 7 are formed at a surface of boron diffusion region 3 with a predetermined space between each other. A gate electrode 11 is formed at a region located between paired n-type source/drain regions 7 with a gate insulating film 9 therebetween.

Paired n-type source/drain regions 7, gate insulating film 9 and gate electrode 11 form an nMOSFET 20.

A nitrogen implanted region 5 is formed at a surface of boron diffusion region 3 located between paired source/drain regions 7. Side walls of gate electrode 11 are covered with side wall spacer 13.

Referring particularly to FIG. 2, a boron concentration at boron diffusion region 3 has a peak concentration (alternate long and short dash line $P_{B1}$—$P_{B1}$) at a position $D_{B1}$ of a depth between 2500 Å and 3500 Å from the surface of silicon substrate 1. A boron concentration $C_{B1}$ at the peak position is less than $1 \times 10^{18}$ cm$^{-3}$.

A nitrogen concentration at nitrogen implanted region 5 has a peak concentration (alternate long and short dash line $P_{N1}$—$P_{N1}$) at a position $D_{N1}$ of a depth not exceeding 500 Å from the surface of semiconductor substrate 1. A nitrogen concentration $C_{N1}$ at the peak position is not less than $1 \times 10^{18}$ cm$^{-3}$.

Source/drain regions 7 of n-type are formed by implantation of arsenic or phosphorus, and a concentration of the impurity (arsenic or phosphorus) is from $1 \times 10^{20}$ to $1 \times 10^{21}$ cm$^{-3}$. A diffusion depth $D_{S/D1}$ of n-type source/drain regions 7 is from 0.15 μm to 0.3 μm. Gate electrode 11 is formed of a polycrystalline silicon layer doped with impurity (which will be referred to as a "doped polycrystalline silicon layer").

A method of manufacturing the semiconductor device of the first embodiment of the invention will now be described below.

Figure 3:
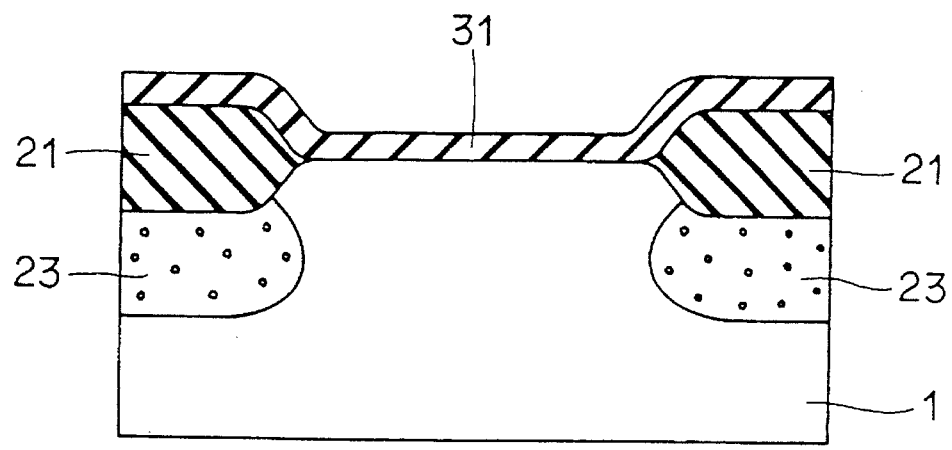
FIGS. 3 to 8 are schematic cross sections showing steps in a process of manufacturing the semiconductor device of the first embodiment of the invention in accordance with the order of process steps.

Referring to FIG. 3, element isolating oxide films 21 are formed at the surface of silicon substrate 1 by the ordinary LOCOS method. At the same time as the formation of element isolating oxide films 21, isolating implantation regions 23 under isolating oxide films 21 are formed. Thereafter, a pad oxide film 31 of 300 Å in thickness is formed on the whole surface, e.g., by the CVD method.

Figure 4:
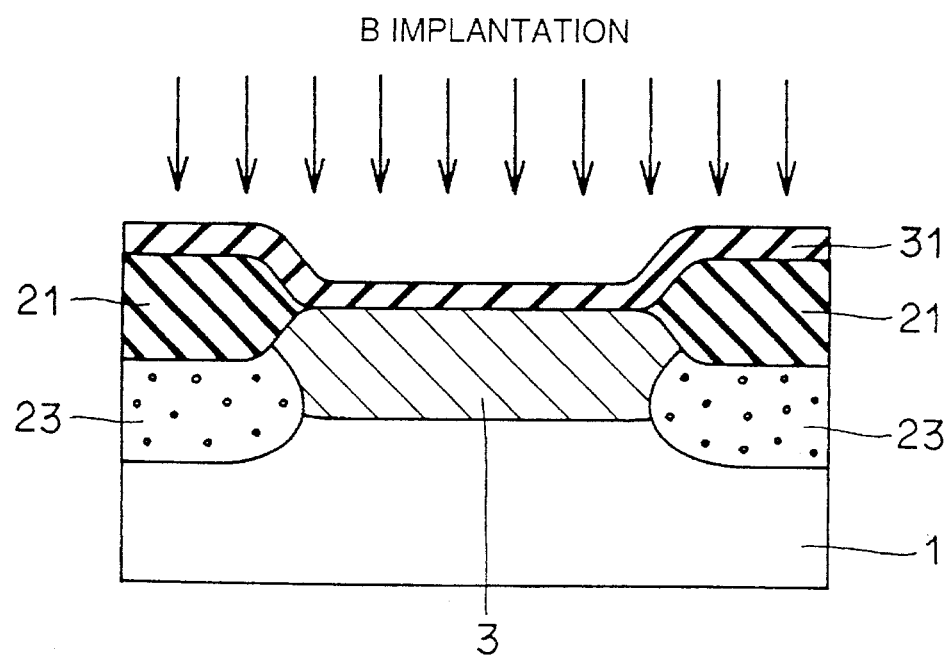

Referring to FIG. 4, boron ions (B$^+$) for controlling a threshold voltage of the channel region are ion-implanted into the whole surface. This ion-implantation is performed under the conditions of implantation energy of 50 keV and dose of $2 \times 10^{12}$–$8 \times 10^{12}$ cm$^{-2}$. Thereafter, a predetermined heat treatment is performed for diffusing and activating boron ions implanted into silicon substrate 1. This forms at the surface of silicon substrate 1 boron diffusion region 3 having the boron concentration peak at the position of a depth of 2500 Å–3500 Å from the surface of silicon substrate 1 and the boron concentration of $5 \times 10^{16}$–$1 \times 10^{18}$ cm$^{-3}$ at the peak position.

Figure 5:
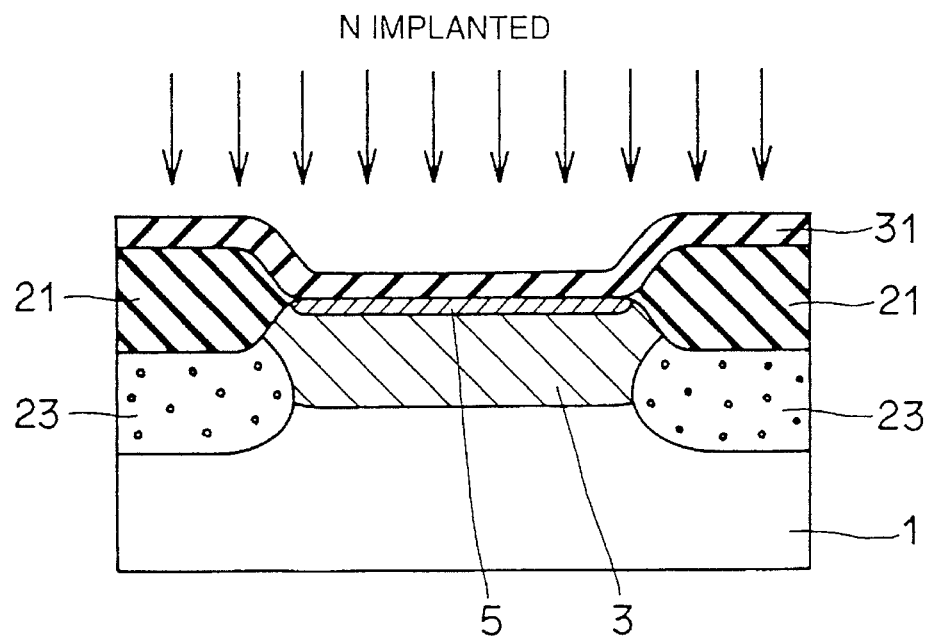

Referring to FIG. 5, nitrogen (N) is implanted into the whole surface under the conditions of implantation energy not more than 23 keV and dose of $5 \times 10^{11}$–$1 \times 10^{13}$ cm$^{-2}$. This forms at the surface of silicon substrate 1 the nitrogen implanted region 5 having the peak concentration at the position of a depth not more than 500 Å from the surface of silicon substrate 1 and the nitrogen concentration not less than $1 \times 10^{18}$ cm$^{-3}$ at the peak position. Then, pad oxide film 31 is etched and removed.

Figure 6:
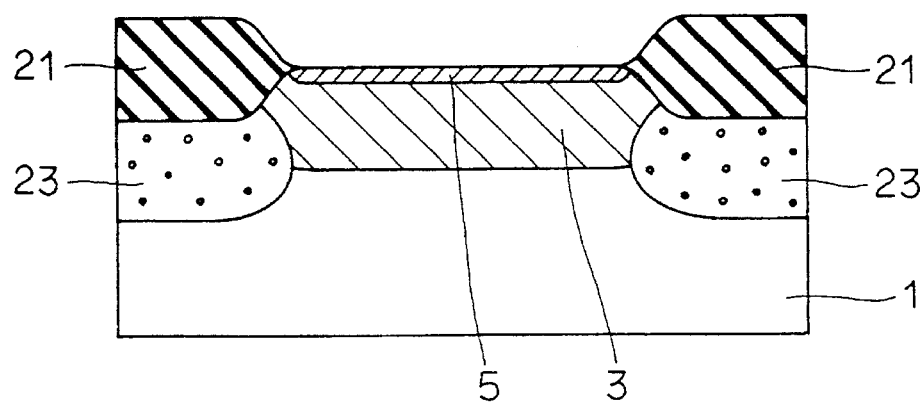

Referring to FIG. 6, this etching exposes the surface of silicon substrate 1.

Figure 7:
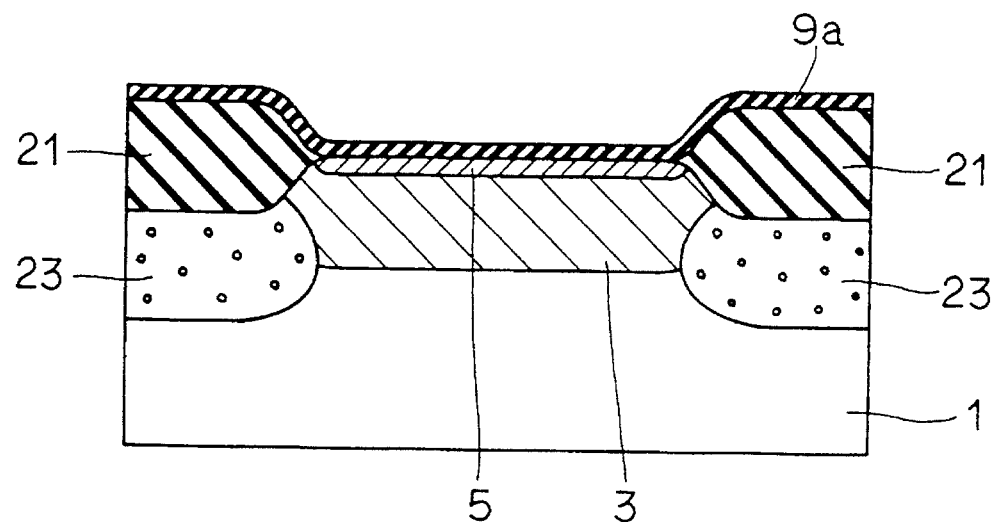

Referring to FIG. 7, a silicon oxide film 9a which will form the gate oxide film is formed on the whole surface, e.g., by thermal oxidation.

Figure 8:
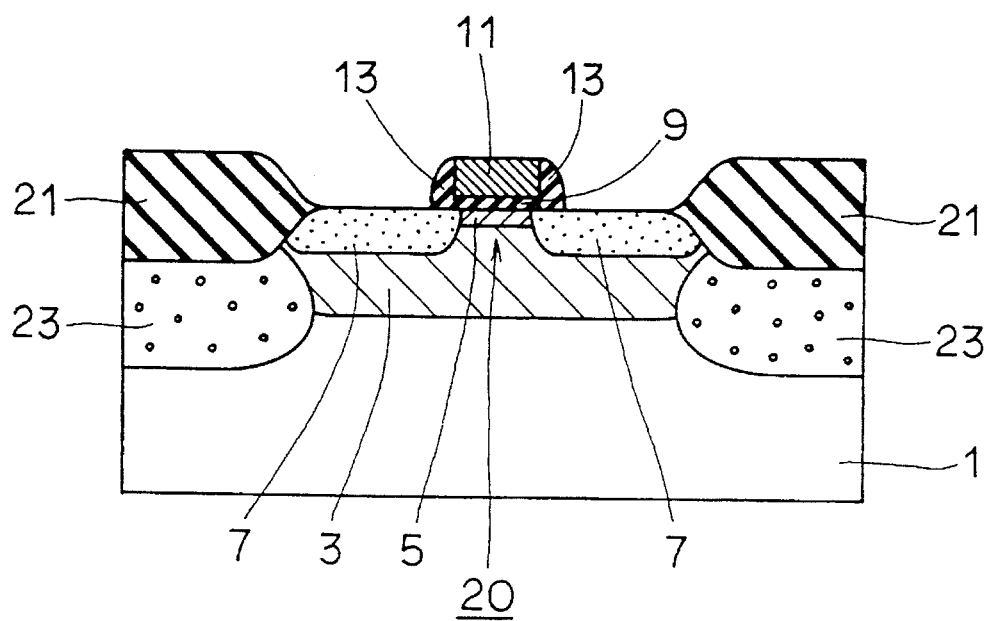

Referring to FIG. 8, patterned gate electrode 11 is formed on the surface of silicon oxide film 9a forming the gate insulating film. Using this gate electrode and others as a mask, ion implantation of n-type impurity such as arsenic or phosphorus is carried out. This forms at the surface of silicon substrate 1 n-type source/drain regions 7 having the impurity concentration of $1 \times 10^{20}$–$1 \times 10^{21}$ cm$^{-3}$ and the diffusion depth of 0.15–0.3 μm from the surface of silicon substrate 1.

In this manner, paired source/drain regions 7, gate insulating film 9 and gate electrode 11 form nMOSFET 20.

Thereafter, side wall spacer 13 covering the side walls of gate electrode 11 are formed.

According to the semiconductor device of this embodiment, as shown in FIGS. 1 and 2, nitrogen implanted region 5 is formed such that its nitrogen concentration peak is located at a depth of 500 Å from the surface of silicon substrate 1. Thus, nitrogen implanted region 5 is formed such that it is located at the channel region of MOSFET 20. This nitrogen can serve to suppress diffusion of boron. This prevents diffusion of boron in boron diffusion region 3 toward the channel region, which may be caused, e.g., by a heat treatment at a later step. Accordingly, as shown particularly in FIG. 2, the boron concentration at the channel region can be low. Therefore, the channel region can easily form an inverted layer, and the threshold voltage of MOSFET 20 can be set low. Therefore, even if impurity concentrations at respective portions decrease in accordance with the proportional reduction rule due to miniaturization, the low threshold voltage can be maintained, so that MOSFET 20 of this embodiment is suitable to miniaturization.

Since the boron concentration at the channel region can be low, impurity scattering of electrons flowing through the channel is suppressed to a considerable extent. Therefore, the current drive performance of the transistor is improved. Also for this reason, the MOSFET 20 of this embodiment is suitable to miniaturization.

Further, it is possible to maintain a high boron concentration at a position deeper than the channel region from the surface of silicon substrate 1, while maintaining the low boron concentration at the channel region. Therefore, punch-through at a deep position in the substrate can be prevented, and hence the punch-through breakdown voltage can be improved. Also for this reason, MOSFET 20 of this embodiment is suitable to miniaturization.

Embodiment 2

A semiconductor device of a second embodiment of the invention differs from the first embodiment shown in FIGS. 1 and 2 in the structure of nitrogen implanted region 5.

Figure 9:
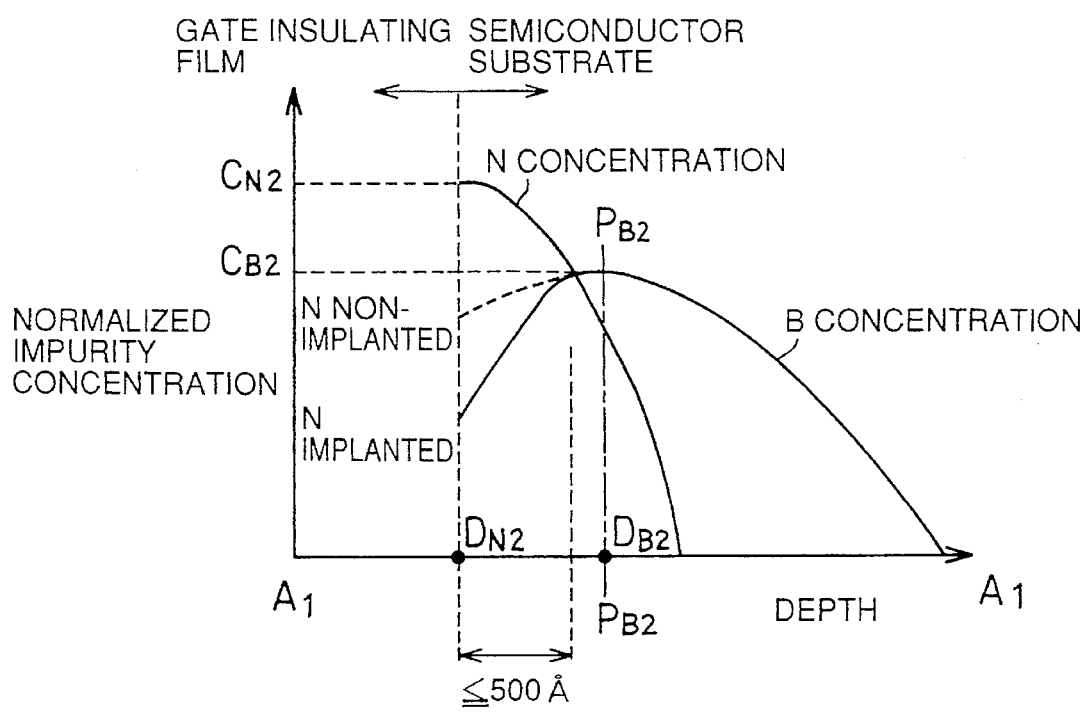
FIG. 9 shows an impurity concentration corresponding to positions along line $A_1$—$A_1$ in FIG. 1 in a second embodiment of the invention.

Referring to FIGS. 1 and 9, the second embodiment includes nitrogen implanted region 5 of which nitrogen concentration peak is located at a depth position $D_{N2}$ on the surface of silicon substrate 1. The impurity concentration at this concentration peak is not less that $1 \times 10^{18}$ cm$^{-3}$.

Impurity concentrations of other regions including boron diffusion region 3 are the substantially same as those in the first embodiment, and hence will not be described below.

The method of manufacturing the semiconductor device of this embodiment differs from the method of manufacturing the first embodiment shown in FIGS. 3 and 8 in the conditions for forming the nitrogen implanted region.

More specifically, referring to FIG. 5, nitrogen is implanted under the conditions of implantation energy of 14 keV and dose of $5 \times 10^{11}$–$1 \times 10^{13}$ cm$^{-2}$. Thereby, nitrogen diffusion region 5 is formed on the surface of silicon substrate 1 such that its nitrogen peak concentration is located at the surface of silicon substrate 1.

Pad oxide film 31 has a film thickness of 300 Å.

The manufacturing method other than the above is the substantially same as that in the first embodiment, and hence will not be described below.

In the semiconductor device of this second embodiment, the nitrogen diffusion region 5 has the nitrogen concentration peak located at the surface of silicon substrate 1. Thus, nitrogen implanted region 5 is located at the channel region of MOSFET 20. Similarly to the first embodiment, nitrogen diffusion region 5 can therefore prevent diffusion of boron into the channel region, and the boron concentration can be low at the channel region. Accordingly, the channel region can easily form an inverted layer, and the threshold voltage of transistor can be set low. As a result, even if impurity concentrations at respective portions decrease in accordance with the scaling rule due to miniaturization, the low threshold voltage can be maintained, so that MOSFET 20 of this embodiment is suitable to miniaturization.

Since the boron concentration at the channel region can be low, impurity scattering of electrons flowing through the channel is suppressed to a considerable extent. Therefore, the current drive performance of the transistor is improved. Also for this reason, the MOSFET 20 of this embodiment is suitable to miniaturization.

Further, it is possible to maintain a high boron concentration at a position deeper than the channel region from the surface of silicon substrate 1, while maintaining the low boron concentration at the channel region. Therefore, punch-through at a deep position in the substrate can be prevented, and hence the punch-through breakdown voltage can be improved. Also for this reason, MOSFET 20 of this embodiment is suitable to miniaturization.

Embodiment 3

Figure 10:
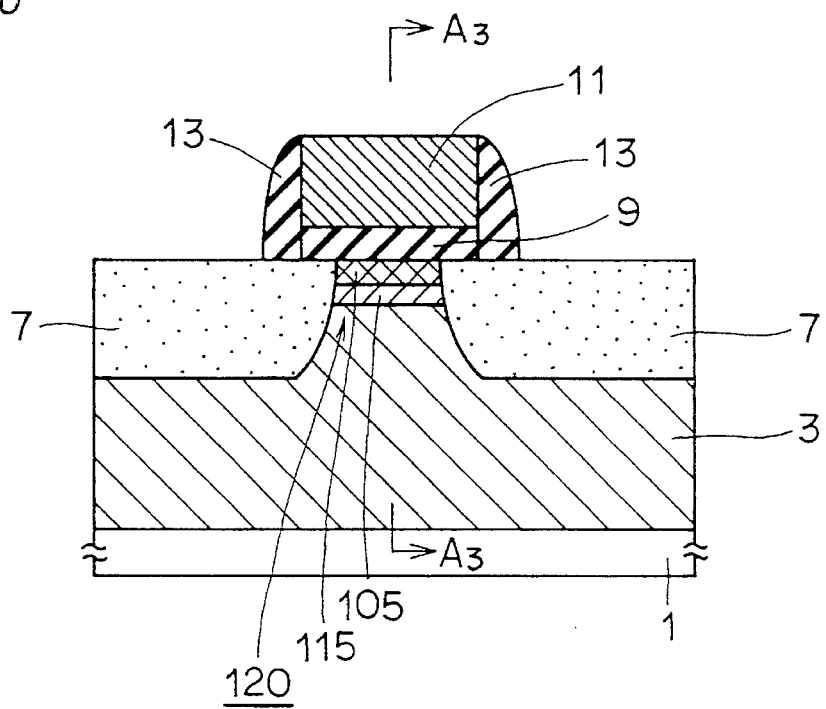
FIG. 10 is a cross section schematically showing a structure of a semiconductor device of a third embodiment of the invention.
Figure 11:
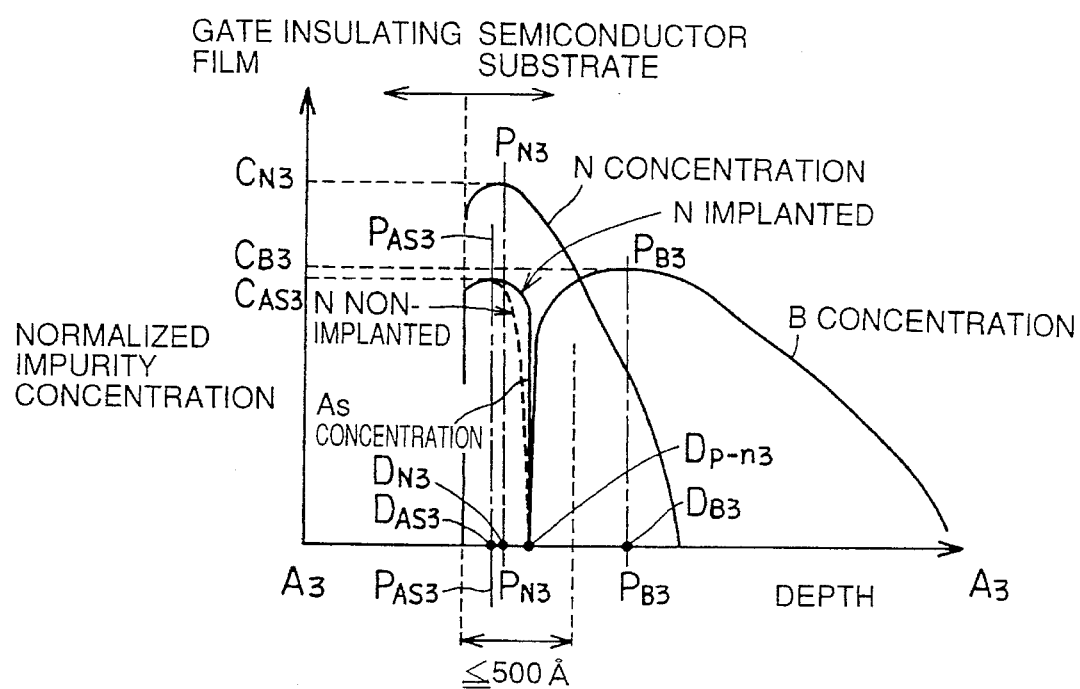
FIG. 11 shows an impurity concentration corresponding to positions along line $A_3$—$A_3$ in FIG. 10.

Referring to FIGS. 10 and 11, boron diffusion region 3 is formed at the surface of silicon substrate 1. Paired n-type source/drain regions 7 are formed at the surface of boron diffusion region 3 with a predetermined space between each other. An n-type buried channel region 115 is formed at the surface of silicon substrate 1 located between paired n-type source/drain regions 7. Gate electrode 11 is formed at a region located between paired n-type source/drain regions 7 with gate insulating film 9 therebetween.

Paired n-type source/drain regions 7, gate insulating film 9, gate electrode 11 and buried channel region 115 form an nMOSFET 120.

A nitrogen diffusion region 105 covering buried channel region 115 is formed at a surface of silicon substrate 1 located between paired n-type source/drain regions 7. Side walls of gate electrode 11 are covered with side wall spacer 13.

Referring particularly to FIG. 11, nitrogen implanted region 105 has a nitrogen peak concentration (alternate long and short dash line $P_{N3}$—$P_{N3}$) at a position $D_{N3}$ of a depth not exceeding 500 Å from the surface of semiconductor substrate 1. A nitrogen concentration $C_{N3}$ at the peak position is not less than $1 \times 10^{18}$ cm$^{-3}$.

Buried channel region 115 has an arsenic peak concentration (alternate long and short dash line $P_{AS3}$—$P_{AS3}$) at a position $D_{AS3}$ of a depth of 100 Å–150 Å from the surface of semiconductor substrate 1. An arsenic concentration $C_{AS3}$ at the peak concentration position is not more than $1 \times 10^{18}$ cm$^{-3}$.

Boron diffusion region 3 has a boron peak concentration (alternate long and short dash line $P_{B3}$—$P_{B3}$) at a position $D_{B3}$ of a depth of 2500 Å–3000 Å from the surface of semiconductor substrate 1. A boron concentration $C_{B3}$ at the peak concentration position is from $5 \times 10^{16}$ to $1 \times 10^{18}$ cm$^{-3}$.

A p-n junction formed by n-type buried channel region 115 and p-type boron diffusion region 3 is located at a position $D_{P-N3}$ of a depth of 250–350 Å from the surface of silicon substrate 1.

A method of manufacturing the semiconductor device of the third embodiment of the invention will now be described below.

Figure 12:
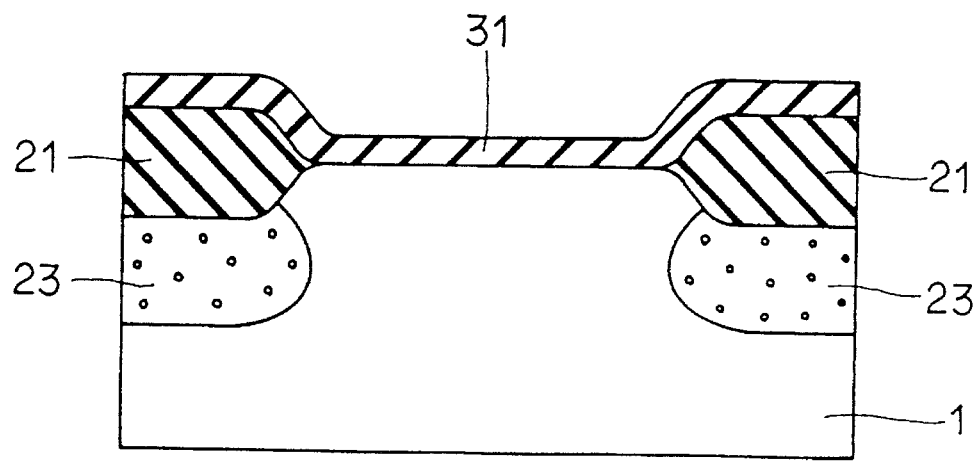
FIGS. 12 to 17 are schematic cross sections showing steps in a process of manufacturing the semiconductor device of the third embodiment of the invention in accordance with the order of process steps.

Referring to FIG. 12, element isolating oxide films 21 are formed at the surface of silicon substrate 1 by the ordinary LOCOS method. At the same time as the formation of element isolating oxide films 21, isolating implantation regions 23 being in contact with lower surfaces of element isolating oxide films 21 are formed. Thereafter, the CVD method or the like is executed to form pad oxide film 31 of 300 Å in thickness on the whole surface.

Figure 13:
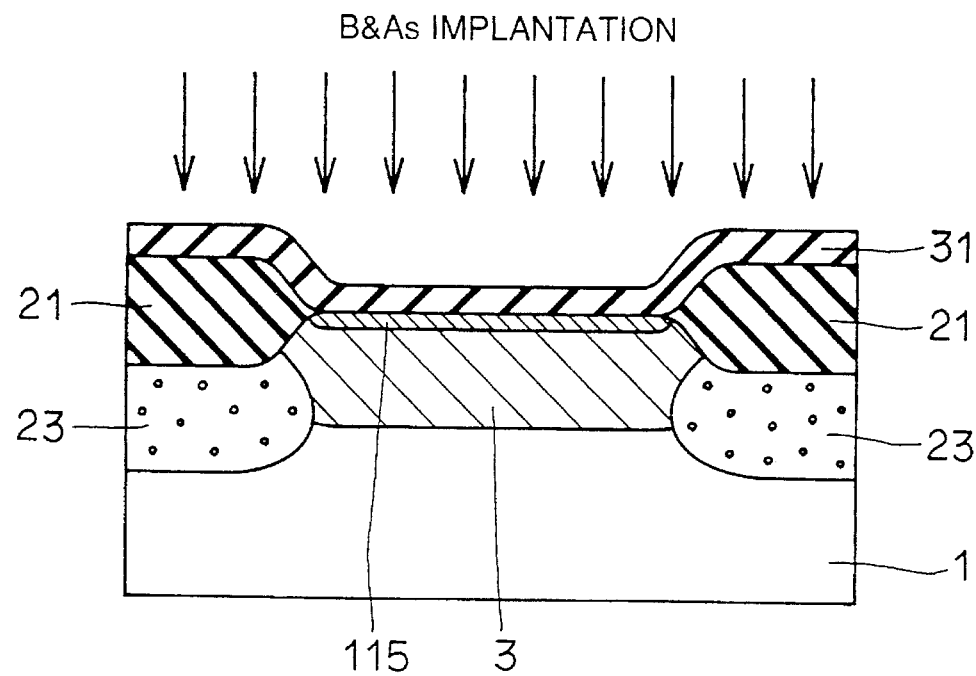

Referring to FIG. 13, boron ions are ion-implanted into the whole surface under the conditions of implantation energy of 50 keV and dose of $5 \times 10^{12}$–$8 \times 10^{12}$ cm$^{-2}$. The process including this ion-implantation forms boron diffusion region 3 having the boron peak concentration at the position of a depth of 2500–3000 Å from the surface of silicon substrate 1 and the boron concentration not more than $1 \times 10^{18}$ cm$^{-3}$ at the peak position. Thereafter, arsenic is ion-implanted. This forms buried channel region 115 having the arsenic peak concentration at the position of a depth of 100–150 Å from the surface of silicon substrate 1 and the arsenic concentration not more than $1 \times 10^{18}$ cm$^{-3}$ at the peak position.

Figure 14:
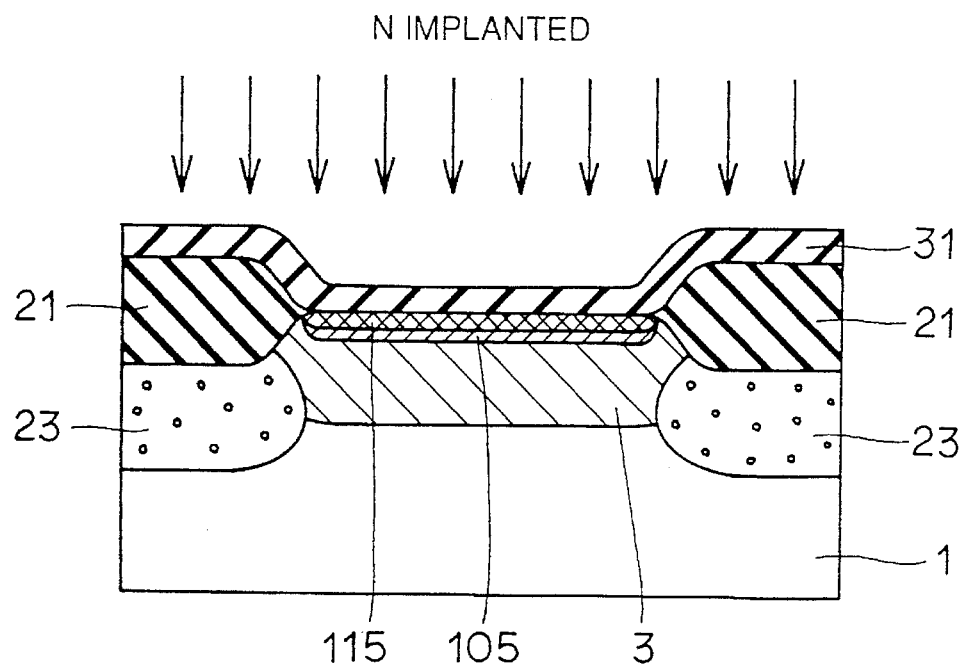

Referring to FIG. 14, nitrogen is implanted under the conditions of implantation energy not more than 23 keV and dose of $5 \times 10^{11}$–$1 \times 10^{13}$ cm$^{-2}$. This implantation forms nitrogen diffusion region 105 having the nitrogen concentration peak at the position of a depth not more than 500 Å from the surface of silicon substrate 1 and the nitrogen concentration not less than $1 \times 10^{18}$ cm$^{-3}$ at the peak position. Nitrogen diffusion region 105 is formed to cover buried channel region 115. Then, pad oxide film 31 is etched and removed.

Figure 15:
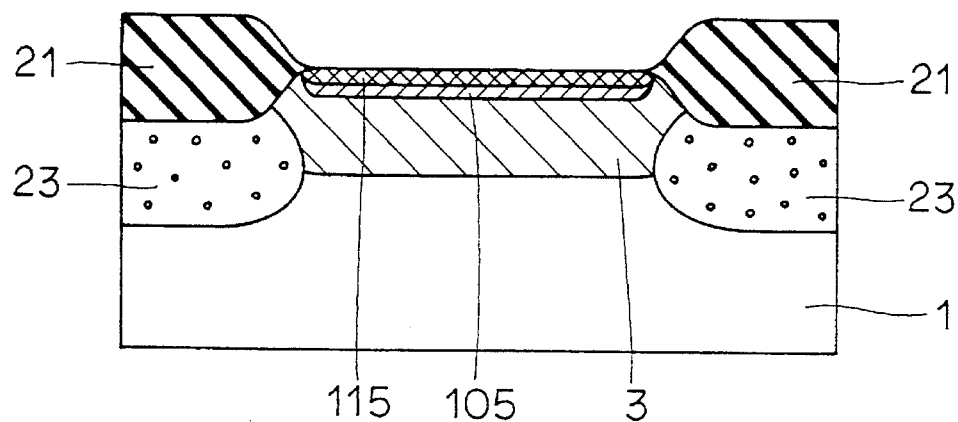

Referring to FIG. 15, this etching exposes the surface of silicon substrate 1.

Figure 16:
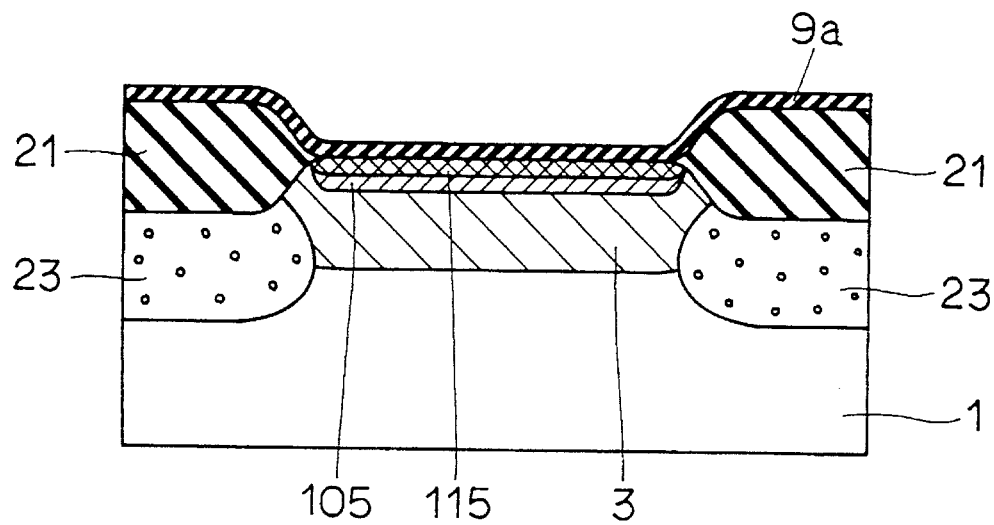
Figure 17:
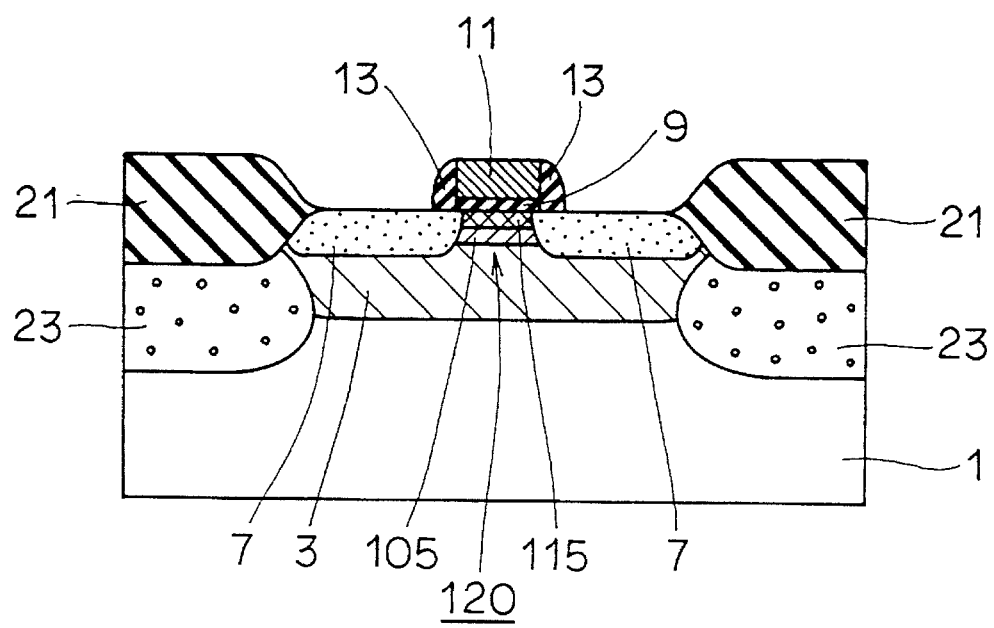

Referring to FIG. 16, silicon oxide film 9a which will form the gate insulating film is formed on the whole surface, e.g., by thermal oxidation. Thereafter, steps similar to those described in connection with the first embodiment are performed to form paired n-type source/drain regions 7, gate insulating film 9, gate electrode 11 and side wall spacer 13 as shown in FIG. 17. Paired n-type source/drain regions 7, gate insulating film 9, gate electrode 11 and buried channel region 115 for nMOSFET 120 of buried channel type.

Figure 18:
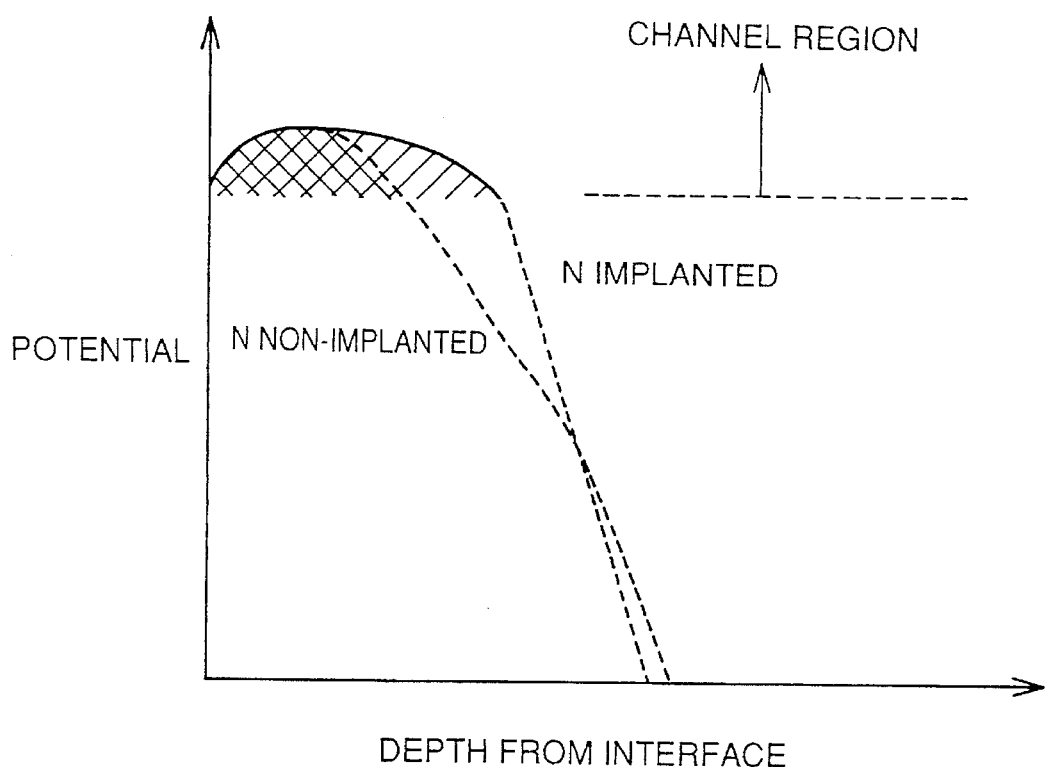
FIG. 18 shows a relationship between a substrate depth and a potential in a structure provided with a nitrogen implanted region and that not provided with the same.

According to the semiconductor device of this embodiment, as shown in FIGS. 10 and 11, nitrogen implanted region 105 is formed to cover buried channel region 115. This nitrogen can serve to suppress diffusion of boron. This nitrogen implanted region 105 prevents diffusion of boron in boron diffusion region 3 toward buried channel region 115. Accordingly, a large concentration gradient of arsenic in buried channel region 115 is maintained at the vicinity of the p-n junction formed by n-type buried channel region 115 and p-type boron diffusion region 3. More specifically, in FIG. 11, the distribution of arsenic concentration at the vicinity of p-n junction between buried channel region 115 and boron diffusion region 3 does not form a small concentration gradient shown in dotted line but forms a large concentration gradient as shown by solid line. Therefore, the potential in the depth direction at the buried channel region can be larger than that in the structure not provided with the nitrogen implanted region as shown in FIG. 18. Accordingly, the wide channel region can be ensured, and hence the drive performance of MOSFET 120 can be improved. For this reason, MOSFET 120 of this embodiment is suitable to miniaturization.

Further, it is possible to maintain a high boron concentration at a position deeper than channel region 115 from the surface of silicon substrate 1, while preventing diffusion of boron in boron diffusion region 3 toward buried channel region 115. Therefore, punch-through at a deep position in the substrate can be prevented, and hence the punch-through breakdown voltage can be improved. Also for this reason, MOSFET 120 of this embodiment is suitable to miniaturization.

Embodiment 4

A semiconductor device of a fourth embodiment of the invention differs from the third embodiment in the structure of the nitrogen implanted region.

Figure 19:
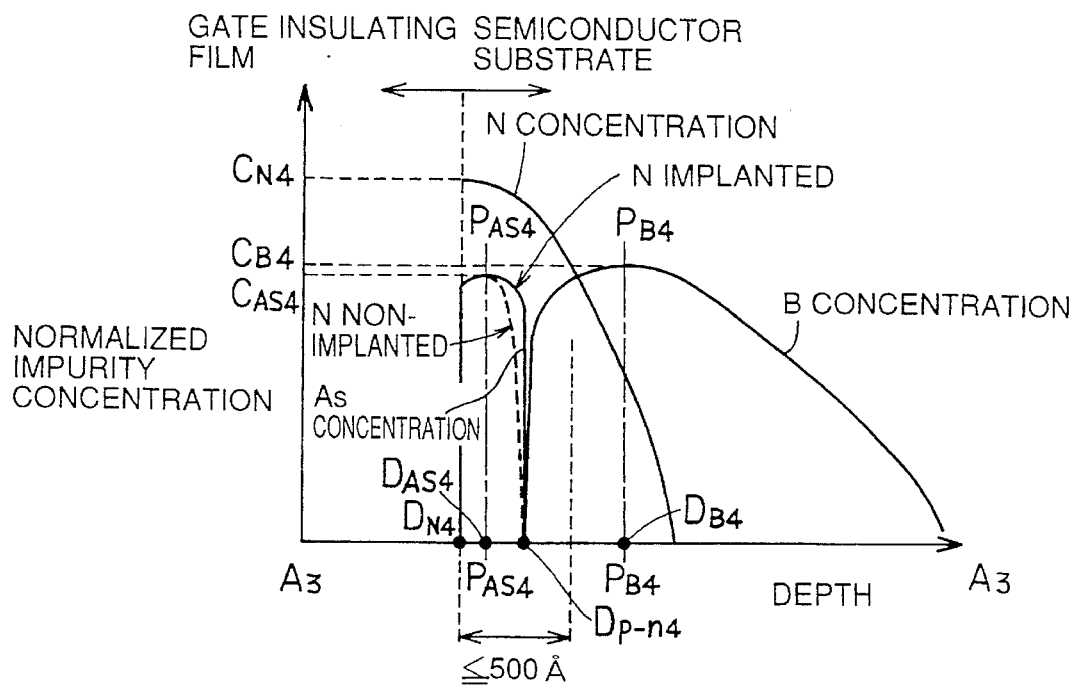
FIG. 19 shows an impurity concentration corresponding to positions along line $A_3$—$A_3$ in FIG. 10 in a fourth embodiment of the invention.

Referring to FIGS. 10 and 19, nitrogen implanted region 115 has a peak nitrogen concentration located at the surface of silicon substrate 1, and has a nitrogen concentration not less that $1 \times 10^{18}$ cm$^{-3}$ at this concentration peak. Structures other than the above are the substantially same as those in the third embodiment, and hence will not be described below.

The method of manufacturing the semiconductor device of the fourth embodiment differs from the manufacturing method of the third embodiment in the conditions for forming the nitrogen implanted region. More specifically, referring to FIG. 14, nitrogen is implanted under the conditions of implantation energy of 14 keV and dose of $5 \times 10^{11} - 1 \times 10^{13}$ cm$^{-2}$. Thereby, nitrogen diffusion region 105, which has a nitrogen concentration peak located at the surface of silicon substrate 1 and has a nitrogen concentration not less that $1 \times 10^{18}$ cm$^{-3}$ at this concentration peak, is formed to cover buried channel region 115.

Pad oxide film 31 at the step of nitrogen implantation has a film thickness of 300 Å.

The manufacturing method other than the above is the substantially same as that in the third embodiment, and hence will not be described below.

According to the semiconductor device of this embodiment, nitrogen implanted region 105 is formed to cover buried channel region 115 similarly to the third embodiment. This nitrogen implanted region prevents diffusion of boron in boron diffusion region 3 toward buried channel region 115. Accordingly, the large concentration gradient in the buried channel region is maintained at the vicinity of the p-n junction formed by boron diffusion region 3 and n-type buried channel region 115. Therefore, the potential in the depth direction at the buried channel region can be large, so that the wide channel region can be ensured. Accordingly, the drive performance of the transistor can be improved. For this reason, the MOSFET of this embodiment is suitable to miniaturization.

Further, it is possible to maintain a high boron concentration at a position deeper than buried channel region 115 from the surface of silicon substrate 1, while preventing diffusion of boron in boron diffusion region 3 toward buried channel region 115. Therefore, punch-through at a deep position in silicon substrate 1 can be prevented, and hence the punch-through breakdown voltage can be improved. Also for this reason, the MOSFET of this embodiment is suitable to miniaturization.

Embodiment 5

Figure 20:
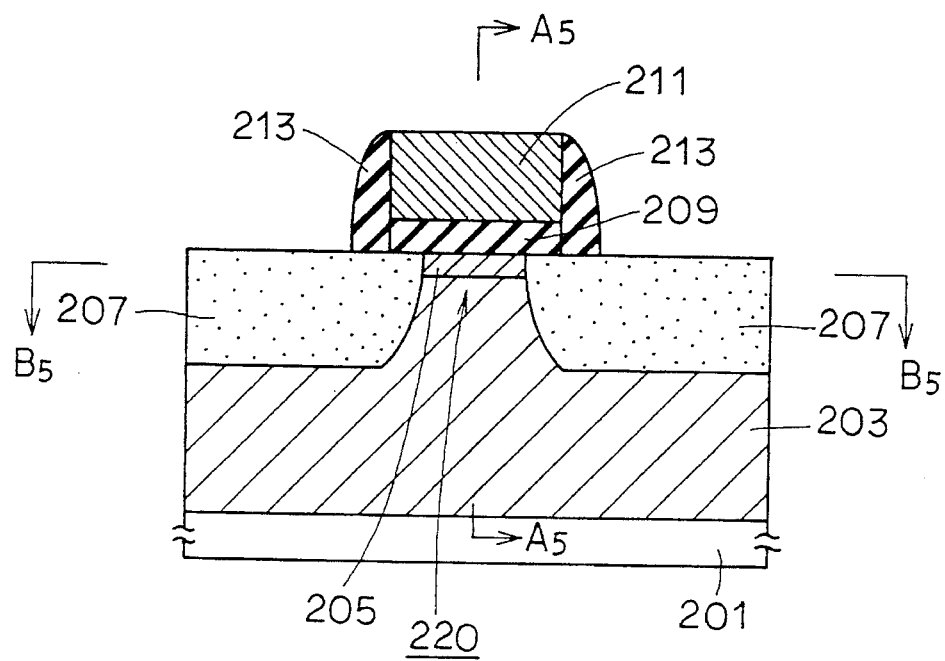
FIG. 20 is a cross section schematically showing a structure of a semiconductor device of a fifth embodiment of the invention.
Figure 21:
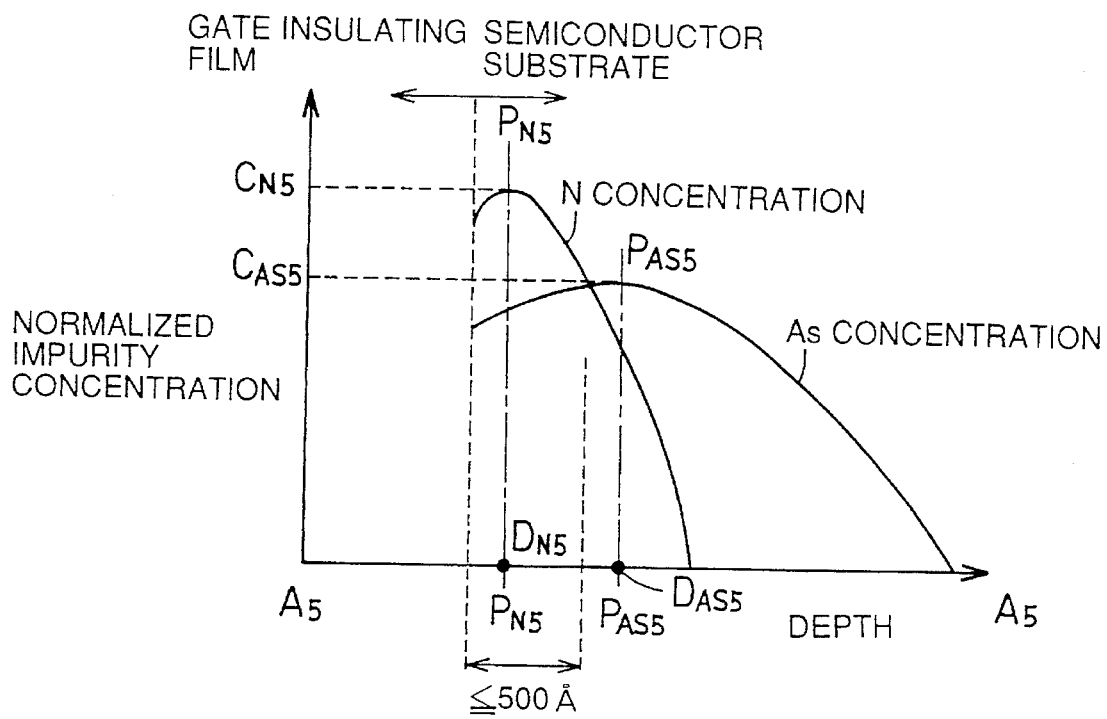
FIG. 21 shows an impurity concentration corresponding to positions along line $A_5$—$A_5$ in FIG. 20.
Figure 22:
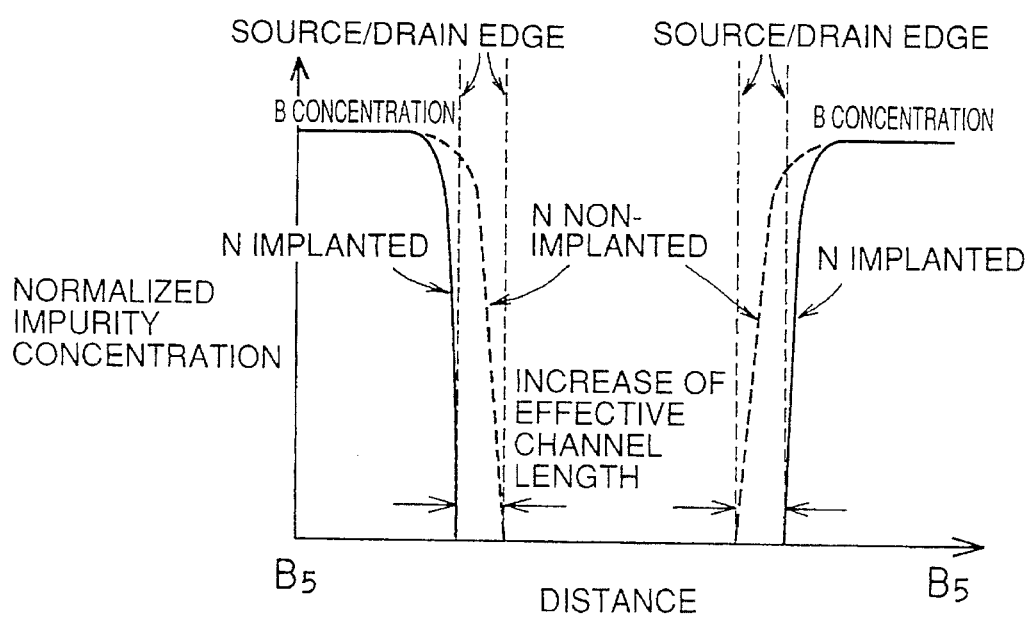
FIG. 22 shows a boron concentration corresponding to positions along line $B_5$—$B_5$ in FIG. 20.

Referring to FIGS. 20, 21 and 22, an n-type impurity diffusion region 203 doped with n-type impurity such as phosphorus or arsenic is formed at the surface of silicon substrate 201. Paired p-type source/drain regions 207 are formed at the surface of n-type impurity diffusion region 203 with a predetermined space between each other. Paired p-type source/drain regions 207 are doped with boron. A gate electrode 211 is formed at a region located between paired p-type source/drain regions 207 with a gate insulating film 209 therebetween.

Paired p-type source/drain regions 207, gate insulating film 209 and gate electrode 211 form a pMOSFET 220 of surface channel type.

A nitrogen implanted region 205 is formed at a surface of silicon substrate 201 located between paired p-type source/drain regions 207. Side walls of gate electrode 211 are covered with side wall spacer 213.

Referring particularly to FIG. 21, nitrogen implanted region 205 has a peak nitrogen concentration (alternate long and short dash line $P_{N5}$—$P_{N5}$) at a position $D_{N5}$ of a depth not exceeding 500 Å from the surface of semiconductor substrate 201. Nitrogen implanted region 205 has a nitrogen concentration $C_{N5}$ not less than $1 \times 10^{18}$ cm$^{-3}$ at the peak position.

n-type impurity diffusion region 203 has an n-type peak impurity concentration (alternate long and short dash line $P_{AS5}$—$P_{AS5}$) at a position $D_{AS5}$ of a depth of 2500–3500 Å from the surface of silicon substrate 201. Also, n-type impurity diffusion region 203 has an n-type impurity concentration $C_{AS5}$ of $5 \times 10^{16} - 1 \times 10^{18}$ cm$^{-3}$ at the peak position.

Referring particularly to FIG. 22, p-type source/drain regions 207 are doped with boron at a concentration of $1 \times 10^{20} - 1 \times 20^{21}$ cm$^{-3}$. A region near the surface of silicon substrate 201 located between paired p-type source/drain regions 207 form the channel region.

A method of manufacturing the semiconductor device of the fifth embodiment of the invention will now be described below.

Figure 23:
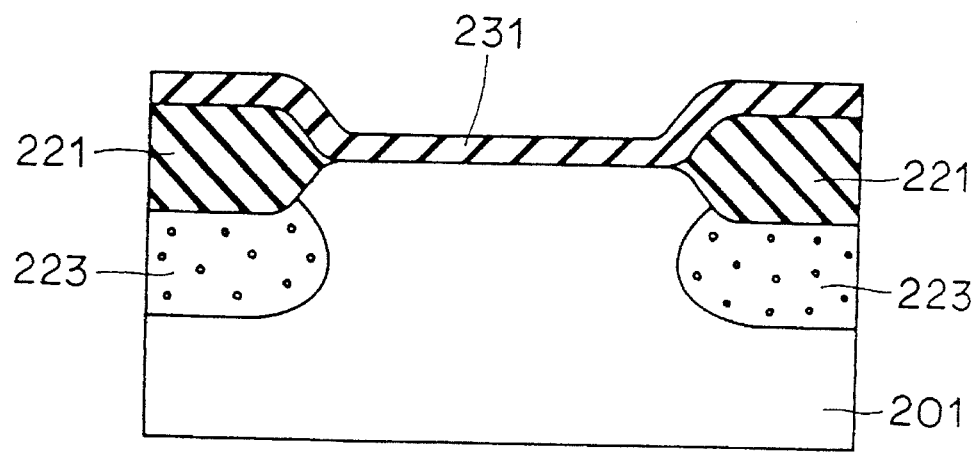
FIGS. 23 to 28 are schematic cross sections showing steps in a process of manufacturing the semiconductor device of the fifth embodiment of the invention in accordance with the order of process steps.

Referring to FIG. 23, element isolating oxide films 221 are formed at the surface of silicon substrate 201 by the ordinary LOCOS method. At the same time as the formation of element isolating oxide films 221, isolating implantation regions 223 under isolating oxide films 221 are formed.

Thereafter, the CVD method or the like is executed to form pad oxide film 231 of 300 Å in thickness on the whole surface.

Figure 24:
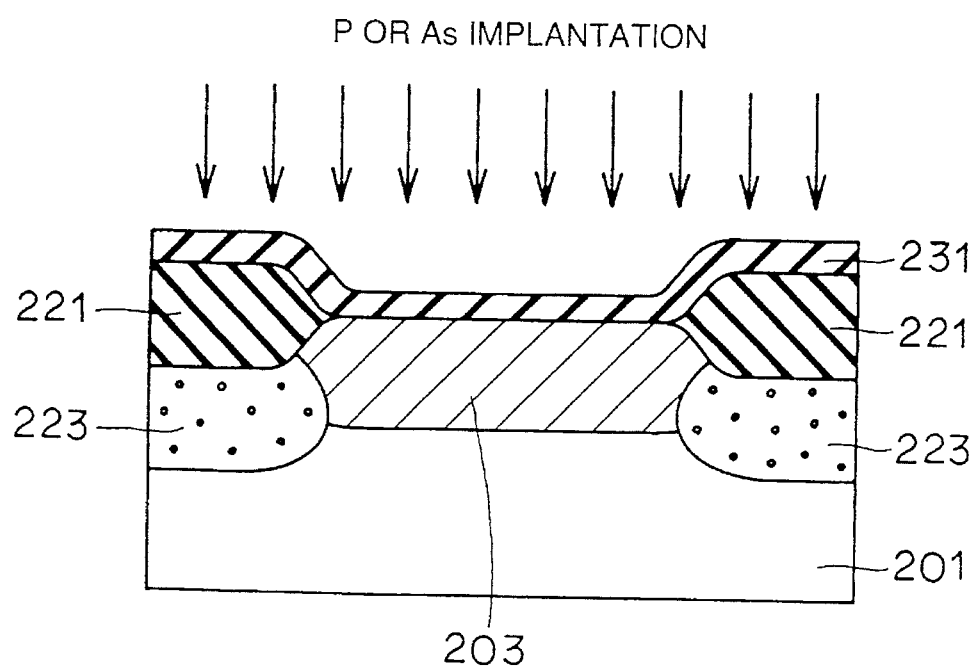

Referring to FIG. 24, n-type impurity such as phosphorus or arsenic is ion-implanted under predetermined conditions. For example, phosphorus ions ($P^+$) are implanted under the conditions of implantation energy of 180 keV and dose of $2\times10^{12}$–$8\times10^{12}$ cm$^{-2}$. This forms n-type impurity diffusion region 203 having the peak impurity concentration at the position of a depth of 2500–3500 Å from the surface of silicon substrate 201 and the n-type concentration of $5\times10^{16}$–$1\times10^{18}$ cm$^{-3}$ at the peak impurity position.

Figure 25:
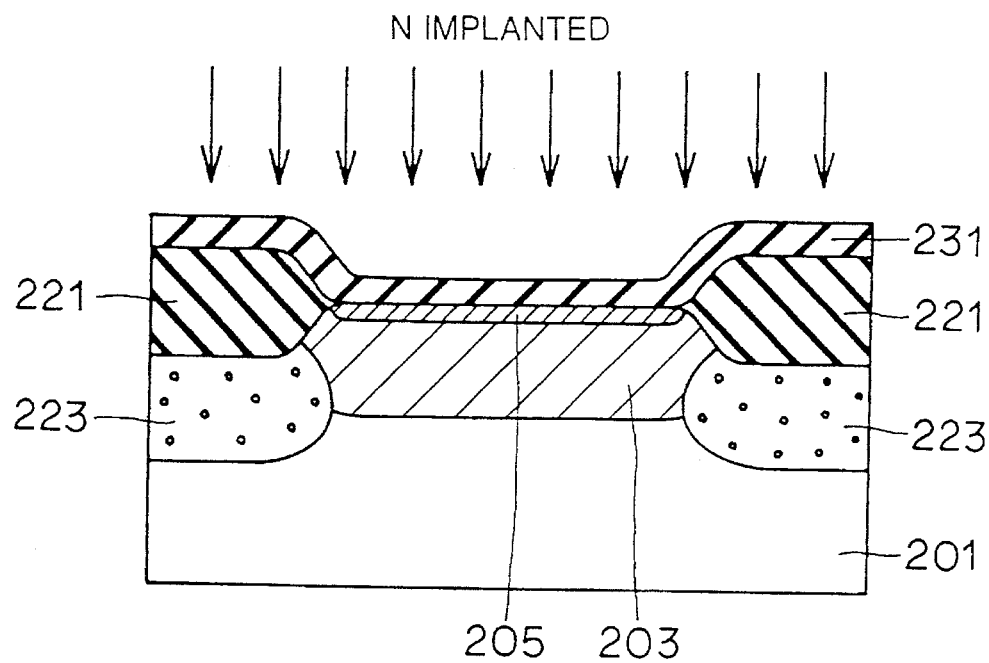

Referring to FIG. 25, nitrogen is implanted under the conditions of implantation energy not more than 23 keV and dose of $5\times10^{11}$–$1\times10^{13}$ cm$^{-2}$. This implantation forms nitrogen implanted region 205 having the nitrogen concentration peak at the position of a depth not more than 500 Å from the surface of silicon substrate 1 and the nitrogen concentration not less than $1\times10^{18}$ cm$^{-3}$ at the peak position. Thereafter, pad oxide film 231 is etched and removed.

Figure 26:
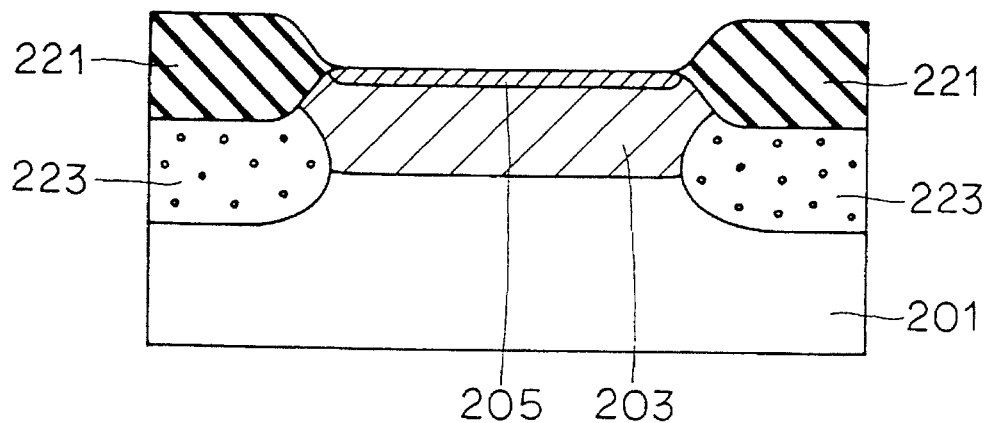

Referring to FIG. 26, this etching exposes the surface of silicon substrate 201.

Figure 27:
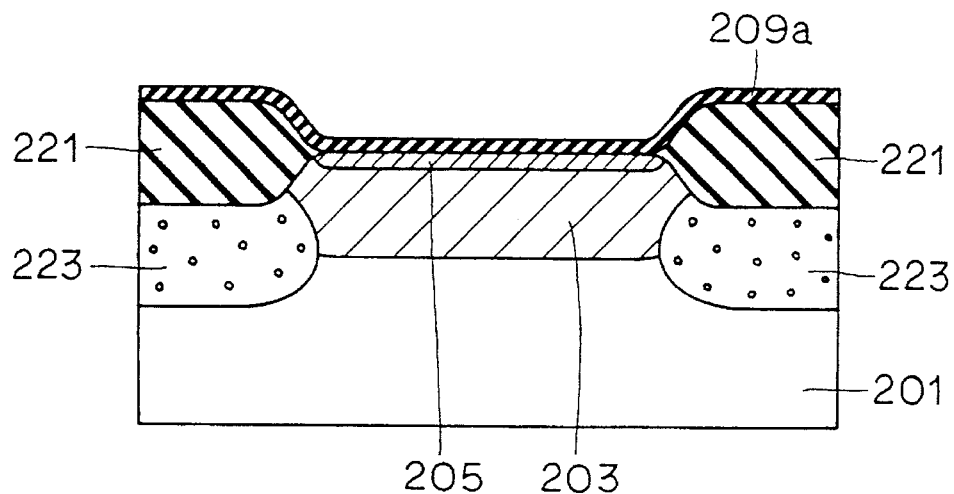

Referring to FIG. 27, a silicon oxide film 209a which will form the gate insulating film is formed on the whole surface, e.g., by thermal oxidation.

Figure 28:
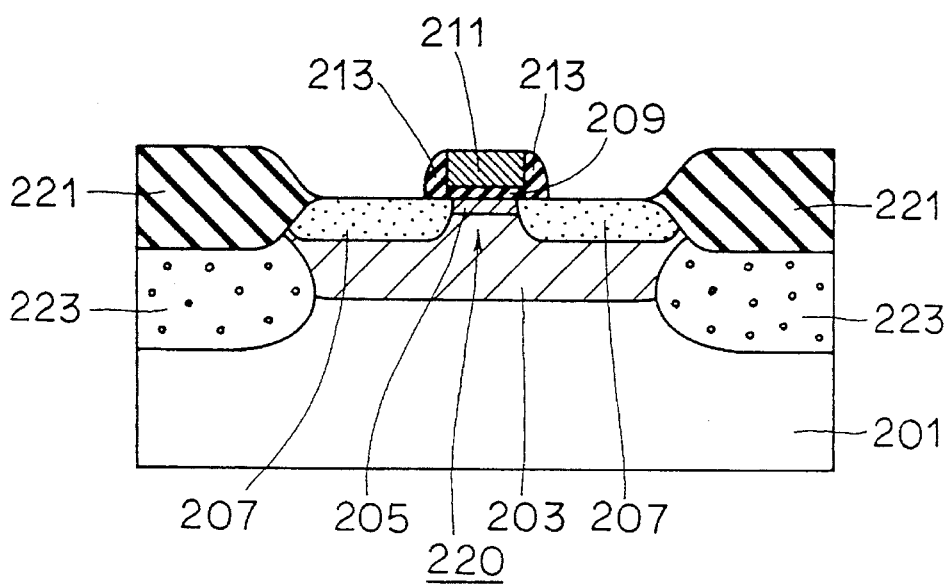

Referring to FIG. 28, patterned gate electrode 211 is formed on the surface of the gate insulating film 209. Using this gate electrode 211 as a mask, boron ions are implanted. This implantation of boron forms p-type source/drain regions 207 at a depth of 0.15–0.3 µm from the surface of silicon substrate 201. Paired p-type source/drain regions 207, gate insulating film 209 and gate electrode 211 form pMOSFET 220 of surface channel type.

Thereafter, side wall spacer 213 covering the side walls of gate electrode 211 are formed.

According to the semiconductor device of this embodiment, nitrogen implanted region 205 has the nitrogen concentration peak located at a position of a depth not exceeding 500 Å from the surface of silicon substrate 201. Thus, nitrogen implanted region 205 is formed at the channel region of MOSFET 220. This prevents diffusion of boron in paired p-type source/drain regions 207, which may be caused, e.g., by a heat treatment at a later step. Accordingly, as shown in FIG. 22, extension of p-type source/drain regions 207 toward the channel region is prevented, and a substantial channel length (effective channel length) can be long. Therefore, MOSFET 220 of this embodiment is suitable to miniaturization.

Embodiment 6

A semiconductor device of a sixth embodiment of the invention differs from the fifth embodiment in the structure of the nitrogen implanted region.

Figure 29:
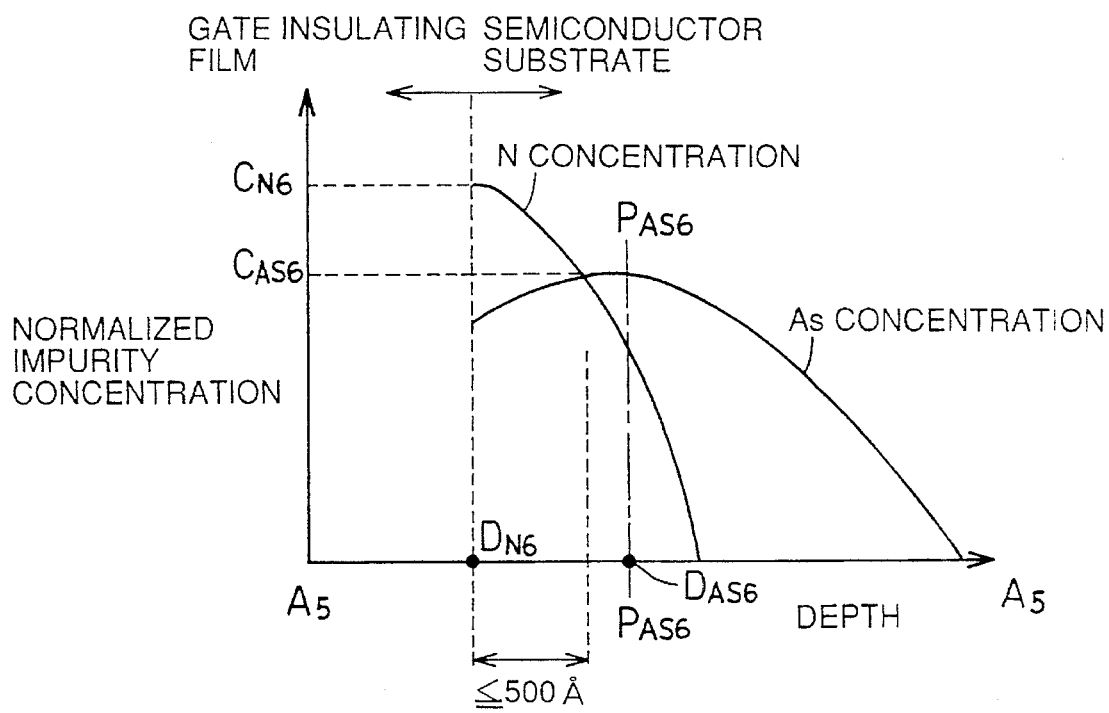
FIG. 29 shows an impurity concentration corresponding to positions along line $A_5$—$A_5$ in FIG. 20 in a sixth embodiment of the invention.

Referring to FIGS. 20 and 29, nitrogen implanted region 205 has a peak nitrogen concentration located at the surface of silicon substrate 201. Also nitrogen implanted region 205 has the nitrogen concentration not less that $1\times10^{18}$ cm$^{-3}$ at the peak concentration.

Structures other than the above are the substantially same as those in the fifth embodiment, and hence will not be described below.

The method of manufacturing the semiconductor device of the sixth embodiment of the invention differs from the manufacturing method of the fifth embodiment in the nitrogen implanting conditions for forming the nitrogen implanted region.

Referring to FIG. 25, nitrogen is implanted under the conditions of implantation energy of 14 keV and dose of $5\times10^{11}$–$1\times10^{13}$ cm$^{-2}$. Thereby, nitrogen implanted region 205, which has a peak nitrogen concentration located at the surface of silicon substrate 201 and has a nitrogen concentration not less that $1\times10^{18}$ cm$^{-3}$ at the peak concentration, is formed.

Pad oxide film 231 at the step of nitrogen implantation has a film thickness of 300 Å.

The manufacturing method other than the above is the substantially same as that in the fifth embodiment, and hence will not be described below.

According to the semiconductor device of this embodiment, nitrogen implanted region 205 is formed such that its peak nitrogen concentration is located at the surface of silicon substrate 201. Thus, nitrogen implanted region 205 is located at the channel region of pMOSFET 220. Similarly to the fifth embodiment, this prevents diffusion of boron in paired p-type source/drain regions 207 toward the channel region, which may be caused, e.g., by a heat treatment at a later step. Accordingly, extension of p-type source/drain regions 207 toward the channel region is prevented, and a substantial channel length can be long. Therefore, the MOSFET of this embodiment is suitable to miniaturization.

Embodiment 7

Figure 30:
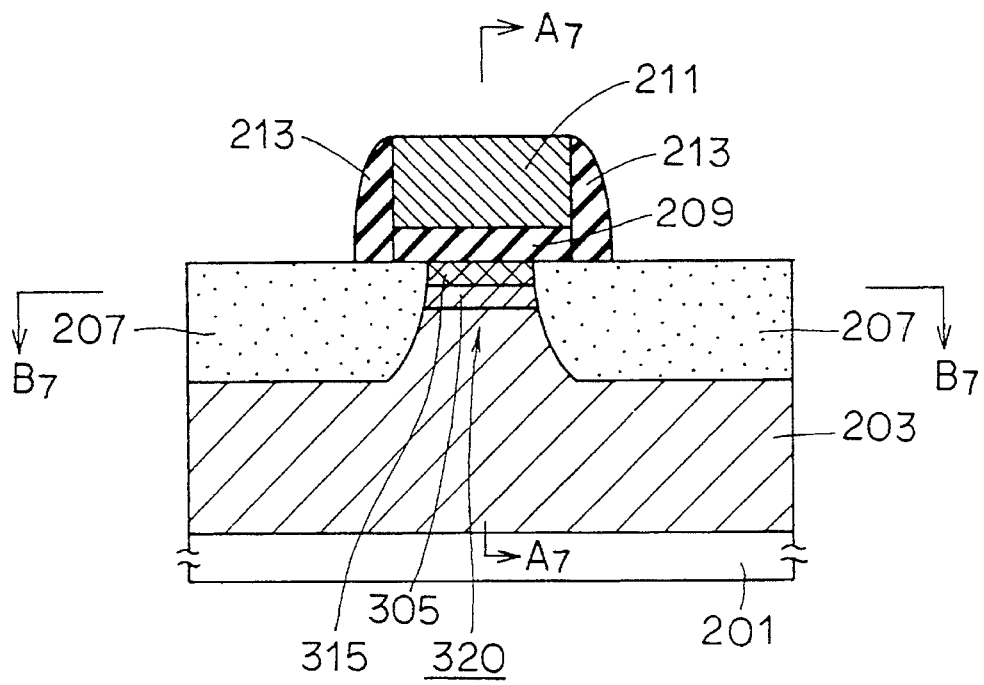
FIG. 30 is a cross section schematically showing a structure of a semiconductor device of a seventh embodiment of the invention.
Figure 31:
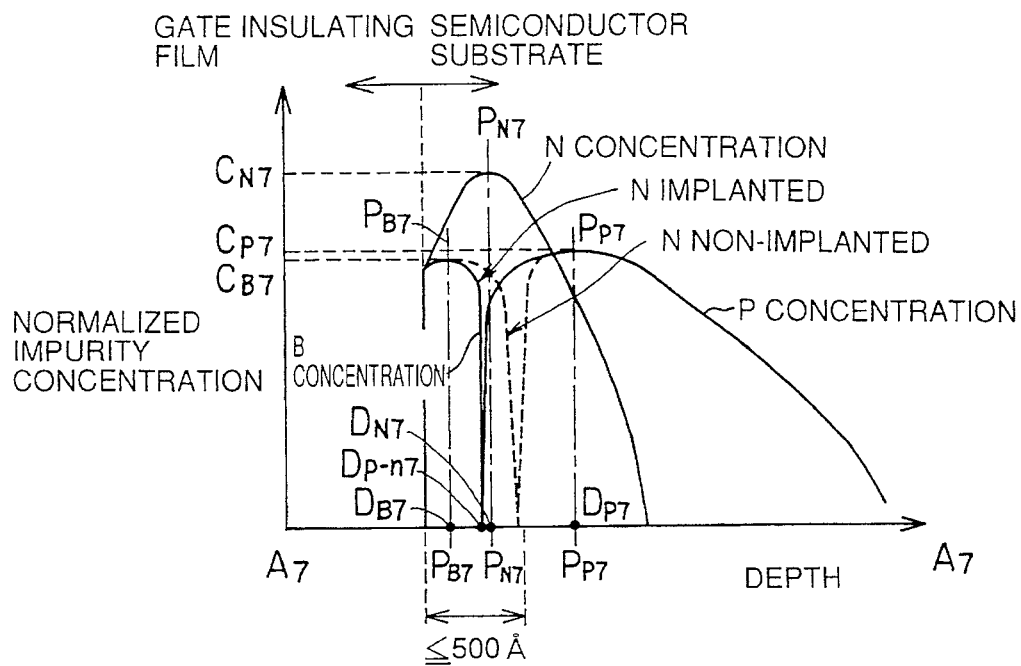
FIG. 31 shows an impurity concentration corresponding to positions along line $A_7$—$A_7$ in FIG. 30.
Figure 32:
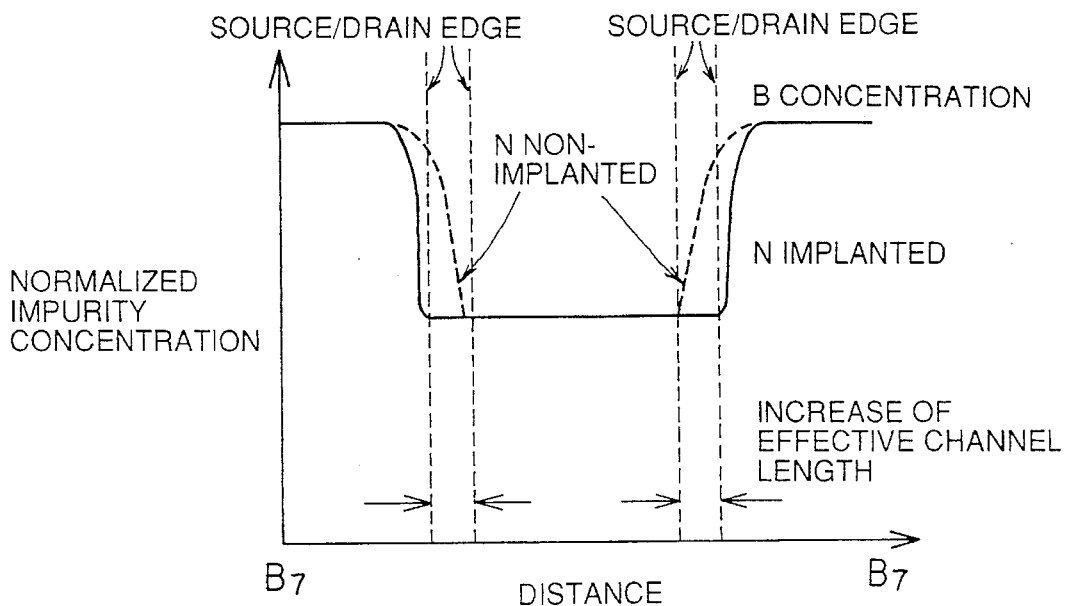
FIG. 32 shows a boron concentration corresponding to positions along line $B_7$—$B_7$ in FIG. 30.

Referring to FIGS. 30, 31 and 32, n-type impurity diffusion region 203 doped with n-type impurity such as phosphorus or arsenic is formed at the surface of silicon substrate 201. Paired p-type source/drain regions 207 are formed at the surface of n-type impurity diffusion region 203 with a predetermined space between each other. Paired p-type source/drain regions 207 are formed by implanting boron. A p-type buried channel region 315 is formed at the surface of silicon substrate 201 located between paired p-type source/drain regions 207. Gate electrode 211 is formed at a region located between paired p-type source/drain regions 207 with gate insulating film 209 therebetween. Paired p-type source/drain regions 207, gate insulating film 209 and gate electrode 211 form a pMOSFET 320 of buried channel type.

A nitrogen implanted region 305 is formed at a surface of silicon substrate 201 located between paired p-type source/drain regions 207. Nitrogen implanted region 305 covers a buried channel region 315. Side walls of gate electrode 211 are covered with side wall spacer 213.

Referring particularly to FIG. 31, nitrogen implanted region 305 has a peak nitrogen concentration (alternate long and short dash line $P_{N7}$—$P_{N7}$) at a position $D_{N7}$ of a depth not exceeding 500 Å from the surface of semiconductor substrate 201, and has a nitrogen concentration not less than $1\times10^{18}$ cm$^{-3}$ at the concentration peak position.

Buried channel region 315 has a peak boron concentration (alternate long and short dash line $P_{B7}$—$P_{B7}$) at a position $D_{B7}$ of a depth of 100–150 Å from the surface of semiconductor substrate 201 and a boron concentration not less than $1\times10^{18}$ cm$^{-3}$ at the concentration peak position.

n-type impurity diffusion region 203 has a concentration peak (alternate long and short dash line $P_{P7}$—$P_{P7}$ $P_{B7}$) of n-type impurity (e.g., phosphorus) at a position $D_{P7}$ of a depth of 2500–3000 Å from the surface of silicon substrate 201 and has an n-type impurity concentration of $5\times10^{16}$–$1\times10^{18}$ cm$^{-3}$ at the concentration peak position.

A p-n junction formed by buried channel region 315 and n-type impurity diffusion region 203 is located at a position of a depth of 250–350 Å from the surface of silicon substrate 201.

Referring particularly to FIG. 32, paired p-type source/drain regions 207 have a boron concentration of $1\times10^{20}$–$1\times20^{21}$ cm$^{-3}$. Buried channel region 315 has a boron concentration of $1\times10^{18}$ cm$^{-3}$ as described before.

A method of manufacturing the semiconductor device of the seventh embodiment of the invention will now be described below.

Figure 33:
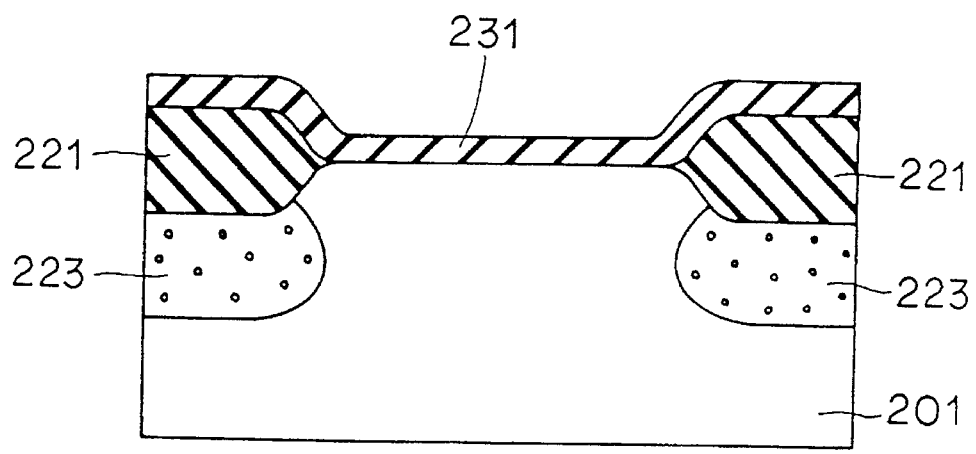
FIGS. 33 to 38 are schematic cross sections showing steps in a process of manufacturing the semiconductor device of the seventh embodiment of the invention in accordance with the order of process steps.

Referring to FIG. 33, element isolating oxide films 221 are formed at the surface of silicon substrate 201 by the ordinary LOCOS method. At the same time as the formation of element isolating oxide films 221, isolating implantation regions 223 under isolating oxide films 221 are formed. Thereafter, the CVD method or the like is executed to form pad oxide film 231 of 300 Å in thickness on the whole surface.

Figure 34:
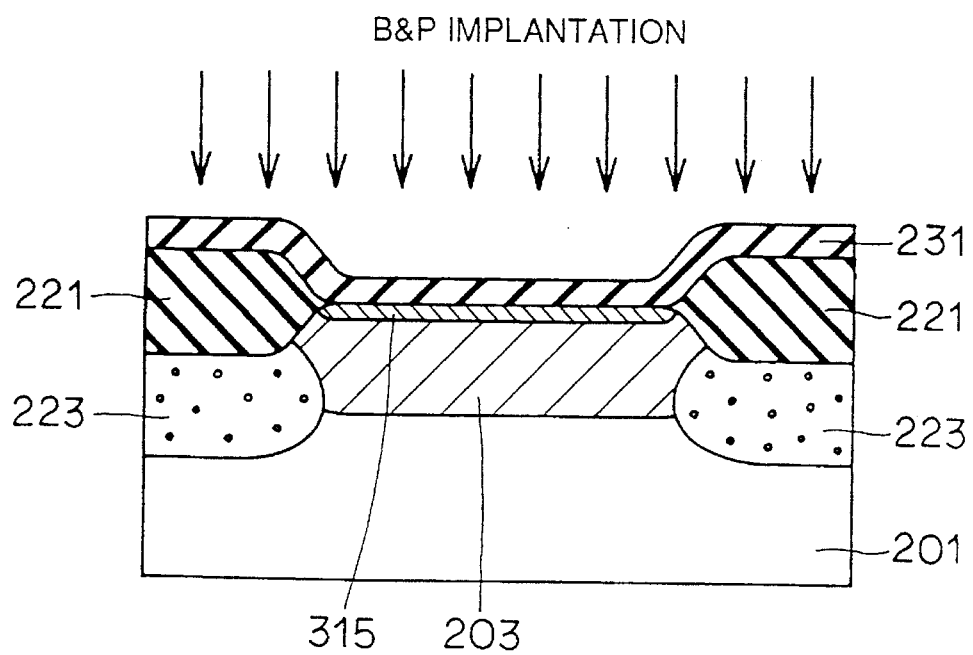

Referring to FIG. 34, n-type impurity is ion-implanted under predetermined conditions. For example, phosphorus ions are implanted under the conditions of implantation energy of 180 keV and dose of $2\times10^{12}$–$8\times10^{12}$ cm$^{-2}$. This forms n-type impurity diffusion region 203 having the peak impurity concentration at the position of a depth of 2500–3000 Å from the surface of silicon substrate 201 and the n-type concentration of $1\times10^{18}$ cm$^{-3}$ at the peak concentration position. Thereafter, boron ions are implanted under the predetermined conditions. This forms buried channel region 315 having the boron concentration peak at the position of a depth of 100–150 Å from the surface of silicon substrate 201 and the boron concentration not more than $1\times10^{18}$ cm$^{-3}$ at the concentration peak.

Figure 35:
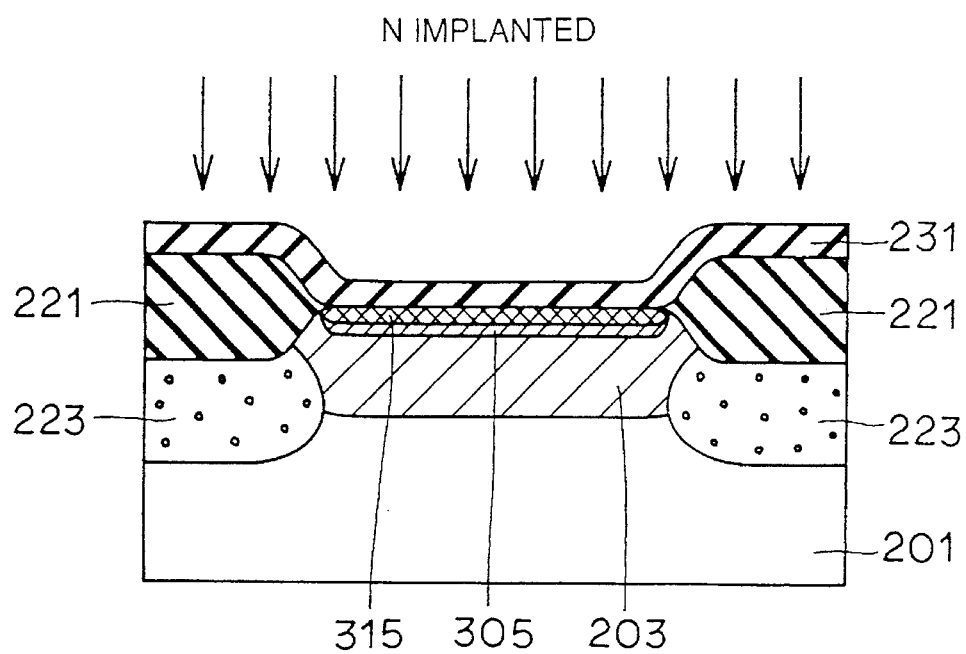

Referring to FIG. 35, nitrogen is implanted under the conditions of implantation energy not more than 23 keV and dose of $5\times10^{11}$–$1\times10^{13}$ cm$^{-2}$. This implantation forms nitrogen implanted region 305 having the nitrogen concentration peak at the position of a depth not exceeding 500 Å from the surface of silicon substrate 201 and the concentration not less than $1\times10^{18}$ cm$^{-3}$ at the concentration peak. Nitrogen implanted region 305 covers buried channel region 315. Thereafter, pad oxide film 231 is etched and removed.

Figure 36:
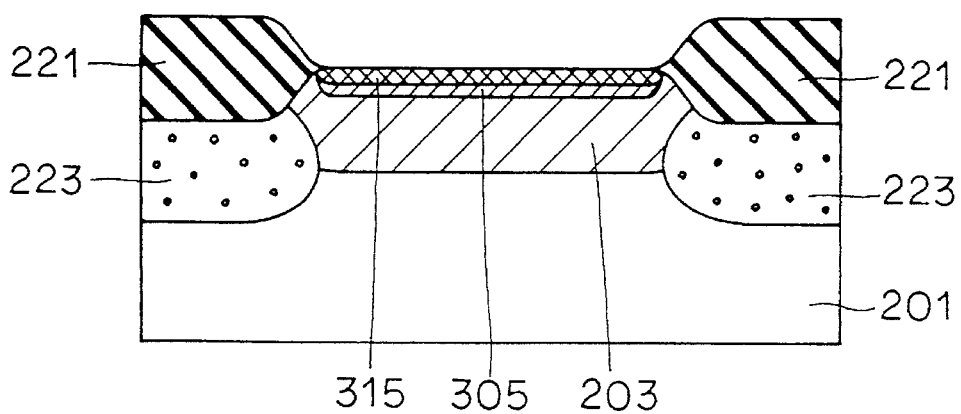

Referring to FIG. 36, this etching removal exposes the surface of silicon substrate 201.

Figure 37:
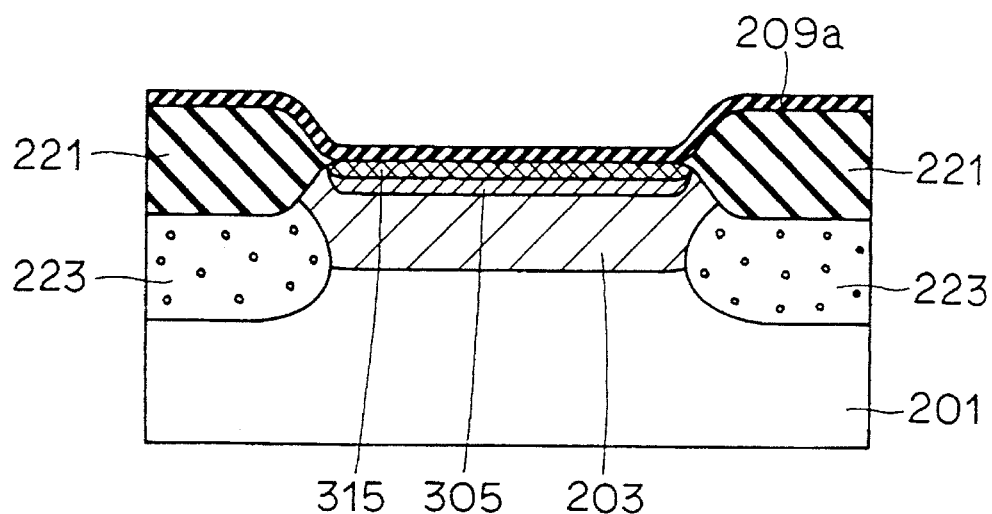
Figure 38:
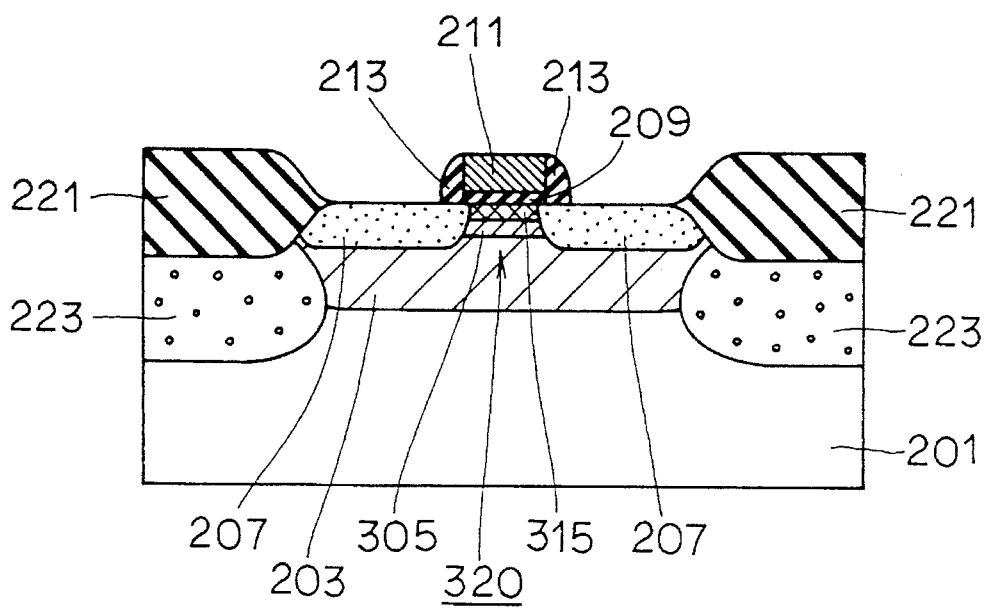

Referring to FIG. 37, a silicon oxide film 210a which will form the gate insulating film is formed on the whole surface, e.g., by thermal oxidation.

Thereafter, steps similar to those in the fifth embodiments are performed to form paired p-type source/drain regions 207, gate insulating film 209 and gate electrode 211. Paired p-type source/drain regions 207, gate insulating film 209, gate electrode 211 and buried channel region 315 form pMOSFET 320 of buried channel type.

Side wall spacer 213 covering the side walls of gate electrode 211 are formed.

According to the semiconductor device of this embodiment, nitrogen implanted region 305 covers buried channel region 315. This prevents diffusion of boron in paired p-type source/drain regions 207 toward the channel region. Accordingly, extension of p-type source/drain regions 207 toward the channel region is prevented, and a substantial channel length (effective channel length) can be long. For this reason, pMOSFET 320 of this embodiment is suitable to miniaturization.

Nitrogen implanted region 305 covers buried channel region 315. This prevents diffusion of boron in the buried channel region, which may be caused, e.g., by a heat treatment at a later step, from a shallow portion toward a deep portion in the substrate. Therefore, a small diffusion depth of the buried channel region can be maintained, and buried channel region 315 can be entirely depleted by applying a voltage to gate electrode 211. Accordingly, generation of a punch-through current is suppressed. Also for this reason, pMOSFET 320 of this embodiment is suitable to miniaturization.

Embodiment 8

A semiconductor device of an eighth embodiment of the invention differs from the seventh embodiment in the structure of the nitrogen implanted region.

Figure 39:
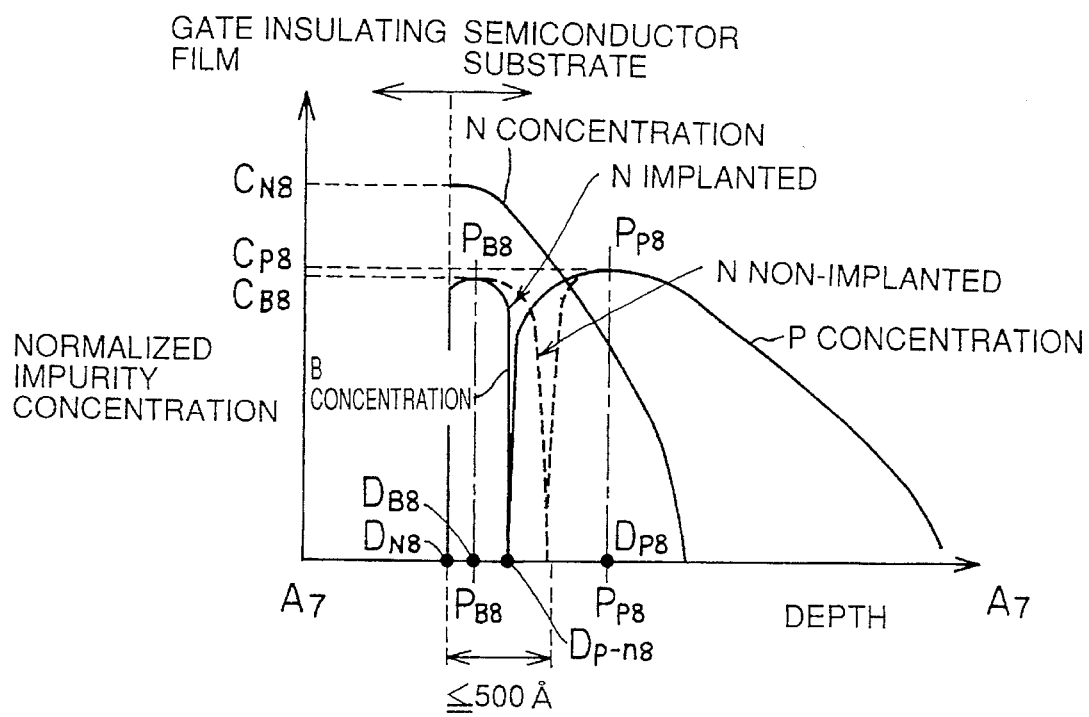
FIG. 39 shows a boron concentration corresponding to positions along line $A_7$—$A_7$ in FIG. 30 in an eighth embodiment of the invention.
Figure 40:
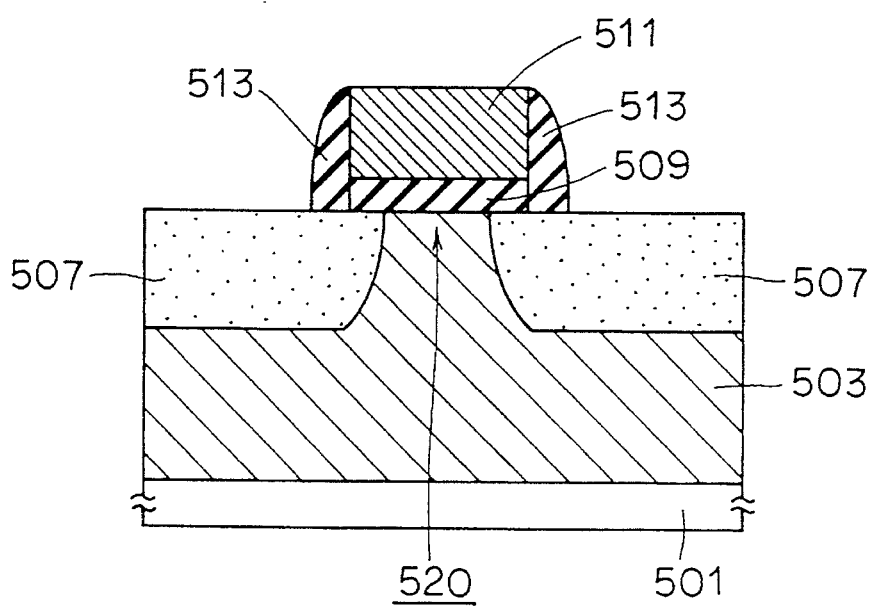
FIG. 40 is a cross section schematically showing a structure of an nMOSFET of surface channel type in the prior art.
Figure 41:
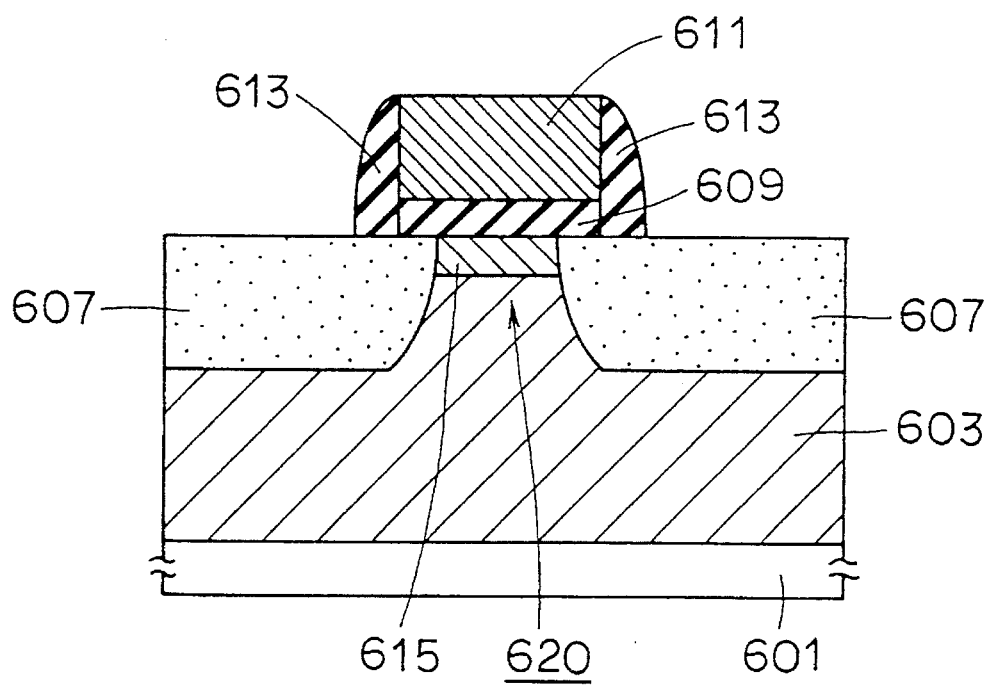
FIG. 41 is a cross section schematically showing a structure of a pMOSFET of buried channel type in the prior art.
Figure 42:
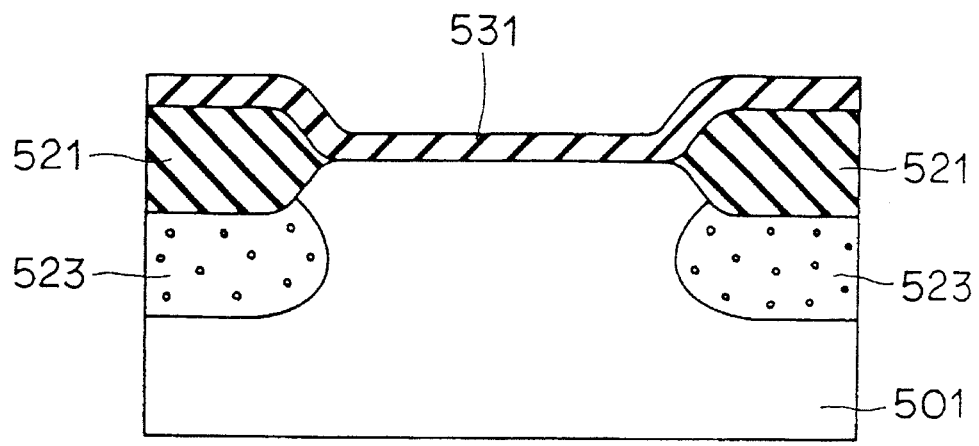
FIGS. 42 to 46 are schematic cross sections showing steps in a conventional process of manufacturing the semiconductor device in accordance with the order of process steps.
Figure 43:
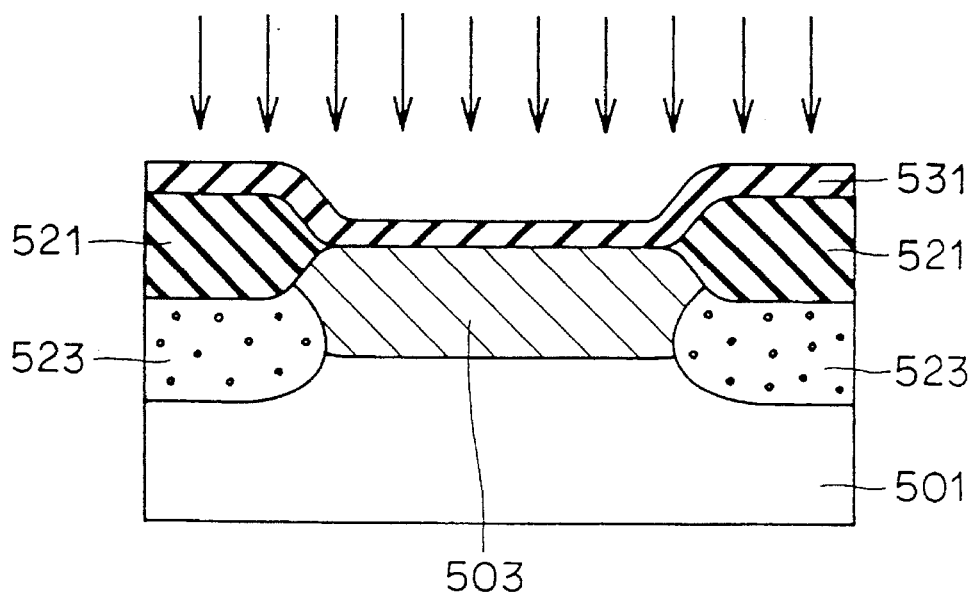
Figure 44:
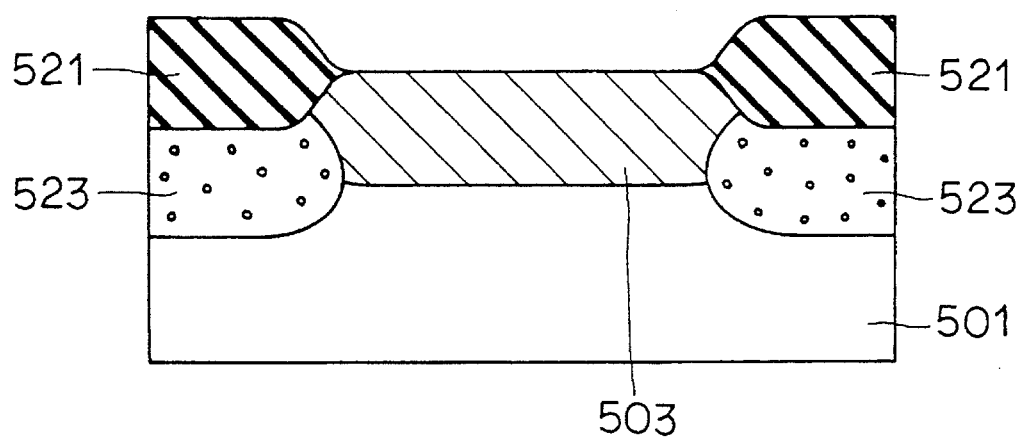
Figure 45:
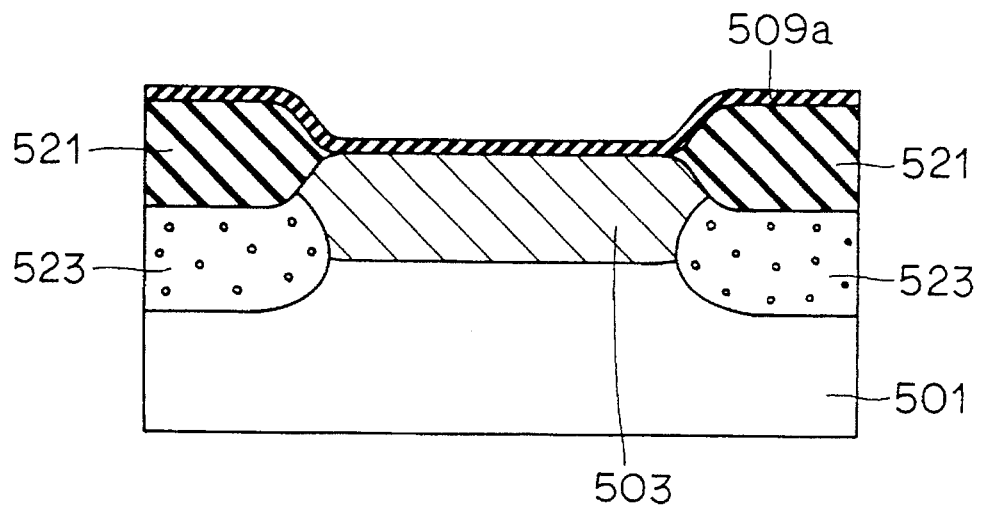
Figure 46:
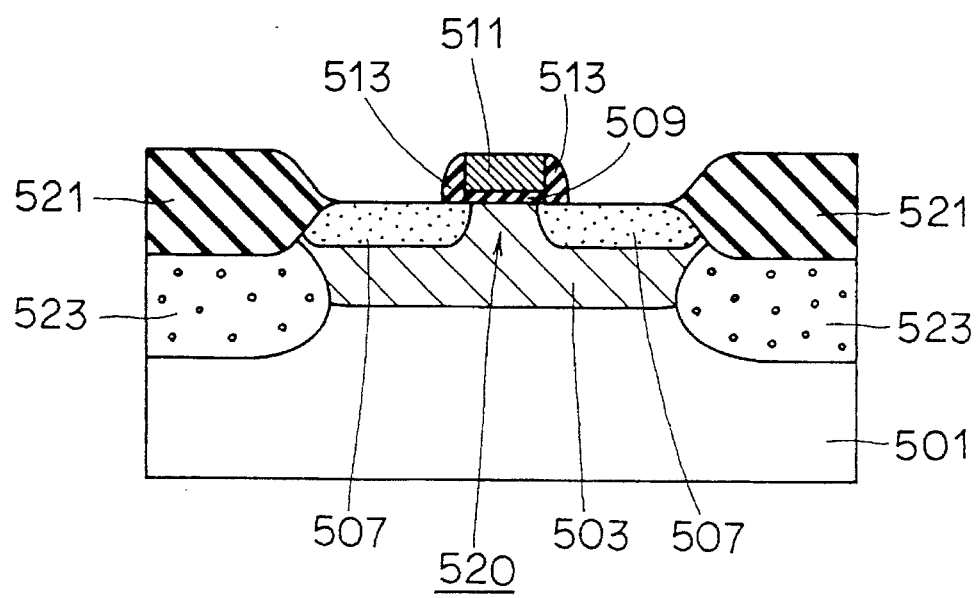

Referring to FIGS. 30 and 39, nitrogen implanted region 305 has a peak nitrogen concentration located at the surface of silicon substrate 201, and has a nitrogen concentration $C_{N8}$ not less that $1\times10^{18}$ cm$^{-3}$ at the concentration peak. Structures other than the above are the substantially same as those in the seventh embodiment, and hence will not be described below.

The method of manufacturing the semiconductor device of the eighth embodiment of the invention differs from the manufacturing method of the seventh embodiment in the nitrogen implanting conditions for forming the nitrogen implanted region.

Referring to FIG. 35, nitrogen is implanted under the conditions of implantation energy of 14 keV and dose of $5\times10^{11}$–$1\times10^{13}$ cm$^{-3}$. Thereby, nitrogen implanted region 305, which has a peak nitrogen concentration located at the surface of silicon substrate 201 and has a nitrogen concentration not less that $1\times10^{18}$ cm$^{-3}$ at this peak concentration, is formed to cover buried channel region 315.

Pad oxide film 231 at this step of nitrogen implantation has a film thickness of 300 Å.

The manufacturing method other than the above is the substantially same as that in the seventh embodiment, and hence will not be described below.

According to the semiconductor device of this embodiment, nitrogen implanted region 305 is formed to cover buried channel region 315. Similarly to the fifth embodiment, this prevents diffusion of boron in p-type source/drain regions 207 toward the channel region, which may be caused, e.g., by a heat treatment in a later step. Accordingly, extension of p-type source/drain regions 207 toward the channel region is prevented, and a substantial channel length (effective channel length) can be long. For this reason, the pMOSFET of this embodiment is suitable to miniaturization.

Nitrogen implanted region 305 covers buried channel region 315. This nitrogen implanted region 305 prevents diffusion of boron in buried channel region 315, which may be caused, e.g., by a heat treatment at a later step, from a shallow portion toward a deep portion in substrate 201. Therefore, the diffusion depth of buried channel region 315 can be small, and buried channel region 315 can be entirely depleted by applying a voltage to gate electrode 211. Accordingly, generation of a punch-through current is suppressed. Also for this reason, the pMOSFET of this embodiment is suitable to miniaturization.

In the first to eighth embodiments, the nitrogen implantation conditions for forming the nitrogen implanted region are not restricted to those already described. For example, instead of the aforementioned conditions for implanting nitrogen employed together the pad oxide layer of 300 Å in film thickness, the film thickness of the pad oxide film may be arbitrarily changed, and the silicon implanting conditions may be changed correspondingly to the changed film thickness. For example, nitrogen in silicon and silicon oxide film presents projection range Rp and dispersion ΔRp as shown in the following table.

TABLE 1

| Implantation Energy (keV) | in Silicon | | in Oxide Film | |
| --- | --- | --- | --- | --- |
| | Rp (μm) | ΔRp (μm) | Rp (μm) | ΔRp (μm) |
| 10 | 0.0219 | 0.0106 | 0.0209 | 0.0102 |
| 20 | 0.0434 | 0.0183 | 0.0428 | 0.0183 |
| 30 | 0.0659 | 0.0251 | 0.0657 | 0.0255 |
| 40 | 0.0888 | 0.0313 | 0.0891 | 0.0318 |
| 50 | 0.1120 | 0.0369 | 0.1124 | 0.0375 |

According to the above table, it is clear that the nitrogen implantation conditions for forming the nitrogen implanted region are to be selected merely such that the nitrogen implanted region has the nitrogen concentration peak at a position of a depth of 500 Å or less from the substrate surface or at the substrate surface.

In a majority of structures in the first to eighth embodiments described above, the silicon oxide film is used as the gate insulating film of the transistor. However, the invention is not restricted to this, and may use another insulating film.

According to the semiconductor devices of the one and another aspects of the invention, the nitrogen introduced region is located at the channel region of the field-effect transistor. This nitrogen serves to suppress diffusion of boron. Therefore, it is possible to prevent boron from diffusing from a region outside the channel region into the channel region, so that the transistor structure suitable to miniaturization can be obtained.

According to the semiconductor device of the preferred aspect of the invention, the nitrogen introduced region prevents diffusion of boron introduced into the semiconductor substrate toward the channel region, which may be caused, e.g., by a heat treatment at a later step. Therefore, the boron concentration can be low at the channel region, so that the threshold voltage of the transistor can be set low.

Since the boron concentration at the channel region can be low, impurity scattering of electrons flowing through the channel can be suppressed to a considerable extent, so that the current drive performance of the transistor is improved.

Further, it is possible to increase the boron concentration at a position deeper than the channel region from the substrate surface, while maintaining the low boron concentration at the channel region. Therefore, punch-through at a deep portion of the substrate can be prevented, and a punch-through breakdown voltage can be improved.

According to the semiconductor device of still another preferred aspect, although the boron in the substrate tends to diffuse from a deep position in the substrate toward the buried channel region, e.g., due to a heat treatment at a later step, this diffusion is prevented by the nitrogen introduced region. Therefore, at the vicinity of the p-n junction formed by the boron introduced into the substrate and the buried channel region, a large concentration gradient can be maintained at the buried channel region. Therefore, a wide channel region can be ensured, and the drive performance of the transistor can be improved.

Further, it is possible to increase the boron concentration at a position deeper than the channel region from the substrate surface, while preventing diffusion of boron introduced into the substrate toward the channel region. Therefore, punch-through at a deep portion of the substrate can be prevented, and a punch-through breakdown voltage can be improved.

According to the semiconductor device of further another preferred aspect of the invention, although the boron in the source/drain regions tends to diffuse toward the channel region, e.g., due to a heat treatment at a later step, this diffusion is prevented by the nitrogen introduced region. Therefore, extension of the source/drain regions toward the channel region is prevented, so that a long substantial channel length can be ensured.

According to the semiconductor device of further preferred aspect of the invention, although the boron in the buried channel region tends to diffuse from a portion near the substrate surface toward a deep portion, e.g., due to a heat treatment at a later step, this diffusion is prevented by the nitrogen introduced region. Therefore, diffusion depth of the buried channel region can be small, and the buried channel region can be entirely depleted by a gate voltage, so that generation of a punch-through current is suppressed.

The method of manufacturing the semiconductor device according to one aspect of the invention can provide the semiconductor device according to one aspect of the invention having the aforementioned effects.

The method of manufacturing the semiconductor device according to another aspect of the invention can provide the semiconductor device according to another aspect of the invention having the aforementioned effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a field-effect transistor comprising:

a semiconductor substrate of a first conductivity type having a main surface;

a pair of source/drain regions of a second conductivity type formed at the main surface of said semiconductor substrate with a predetermined space between each other;

a gate electrode opposed to a region located between said paired source/drain regions and formed on the main surface of said semiconductor substrate with a gate insulating film therebetween; and a nitrogen introduced region formed at a region of said semiconductor substrate located between said paired source/drain regions, containing nitrogen and having a peak concentration of said nitrogen, wherein said peak concentration of said nitrogen is positioned at a depth not exceeding 500 Å from the main surface of said semiconductor substrate.

2. The semiconductor device according to claim 1, wherein said semiconductor substrate has a p-type region containing boron introduced thereinto, and said paired source/drain regions are of an n-type conductivity type.

3. The semiconductor device according to claim 2, further comprising a buried channel region of n-type formed at a region of said semiconductor substrate located between said paired source/drain regions, wherein a p-n junction formed by said n-type buried channel region and said p-type region in said semiconductor substrate containing said boron introduced thereinto is located within said nitrogen introduced region.

4. The semiconductor device according to claim 1, wherein said semiconductor substrate has an n-type region, and said paired source/drain regions have a p-type region containing boron introduced thereinto.

5. The semiconductor device according to claim 4, further comprising a buried channel region of p-type formed by introduction of boron into the main surface of said semiconductor substrate located between said paired source/drain regions, wherein a p-n junction formed by said p-type buried channel region and said n-type region in said semiconductor substrate is located within said nitrogen introduced region.

6. A semiconductor device having a field-effect transistor comprising:

a semiconductor substrate of a first conductivity type having a main surface;

a pair of source/drain regions of a second conductivity type formed at the main surface of said semiconductor substrate with a predetermined space between each other;

a gate electrode opposed to a region located between said paired source/drain regions and formed on the main surface of said semiconductor substrate with a gate insulating film therebetween; and a nitrogen introduced region formed at a region of said semiconductor substrate located between said paired source/drain regions, containing nitrogen and having a peak concentration of said nitrogen, wherein said concentration peak of said nitrogen is located at the main surface of said semiconductor substrate.

7. The semiconductor device according to claim 6, wherein said semiconductor substrate has a p-type region containing boron introduced thereinto, and said paired source/drain regions are of an n-type conductivity type.

8. The semiconductor device according to claim 7, further comprising a buried channel region of n-type formed at a region of said semiconductor substrate located between said paired source/drain regions, wherein a p-n junction formed by said n-type buried channel region and said p-type region in said semiconductor substrate containing said boron introduced thereinto is located within said nitrogen introduced region.

9. The semiconductor device according to claim 6, wherein said semiconductor substrate has an n-type region, and said paired source/drain regions have a p-type region containing boron introduced thereinto.

10. The semiconductor device according to claim 9, further comprising a buried channel region of p-type formed by introduction of boron into the main surface of said semiconductor substrate located between said paired source/drain regions, wherein a p-n junction formed by said p-type buried channel region and said n-type region in said semiconductor substrate is located within said nitrogen introduced region.

* * * * *